US012631519B2

(12) United States Patent
Woessner et al.

(10) Patent No.: US 12,631,519 B2
(45) Date of Patent: May 19, 2026

(54) MEASUREMENT SYSTEM AND METHOD OF USE

(71) Applicant: ASML Netherlands B.V., Veldhoven (NL)

(72) Inventors: Achim Woessner, Eindhoven (NL); Roberto Pagano, Breda (NL); Mark-Jan Spijkman, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 356 days.

(21) Appl. No.: 18/035,895

(22) PCT Filed: Oct. 5, 2021

(86) PCT No.: PCT/EP2021/077390
§ 371 (c)(1),
(2) Date: May 8, 2023

(87) PCT Pub. No.: WO2022/100930
PCT Pub. Date: May 19, 2022

(65) Prior Publication Data
US 2023/0417628 A1      Dec. 28, 2023

(30) Foreign Application Priority Data

Nov. 13, 2020    (EP) ..................................... 20207351

(51) Int. Cl.
*G01M 11/02*      (2006.01)
*G03F 7/00*      (2006.01)
(52) U.S. Cl.
CPC ......... *G01M 11/0271* (2013.01); *G03F 7/706* (2013.01); *G03F 7/706849* (2023.05)

(58) Field of Classification Search
CPC ............... G01M 11/0271; G01M 11/02; G03F 7/7085; G03F 7/20; G01J 9/0215; G01J 9/02
See application file for complete search history.

(56) References Cited

U.S. PATENT DOCUMENTS 6,952,253 B2    10/2005  Lof et al.
8,134,716 B2    3/2012  Emer et al.
(Continued)

FOREIGN PATENT DOCUMENTS

DE        10258142 A1 *  6/2004  ........ G01M 11/0264
JP     2007-518256 A    7/2007
(Continued)

OTHER PUBLICATIONS

International Search Report and Written Opinion of the International Searching Authority directed to related International Patent Application No. PCT/EP2021/077390, mailed Jan. 18, 2022; 11 pages.

*Primary Examiner* — Uzma Alam
(74) *Attorney, Agent, or Firm* — Pillsbury Winthrop Shaw Pittman, LLP

(57) ABSTRACT

A measurement system (11), the measurement system comprising: a sensor apparatus (22); an illumination system (IL1) arranged to illuminate the sensor apparatus with radiation, the sensor apparatus comprising a patterned region arranged to receive a radiation beam and to form a plurality of diffraction beams, the diffraction beams being separated in a shearing direction; the sensor apparatus comprising a radiation detector (24); wherein the patterned region is arranged such that at least some of the diffraction beams form interference patterns on the radiation detector; wherein the sensor apparatus comprises a plurality of patterned regions (19a-19c, 20a, 20b), and wherein pitches of the patterned regions are different in adjacent patterned regions.

18 Claims, 15 Drawing Sheets

(56)     References Cited

U.S. PATENT DOCUMENTS

| | | | |
|---|---|---|---|
| 2008/0231840 A1 | 9/2008 | Emer et al. | |
| 2012/0249985 A1 | 10/2012 | Wischmeier et al. | |
| 2016/0004168 A1 | 1/2016 | Neumann et al. | |
| 2018/0088467 A1 | 3/2018 | Baselmans et al. | |
| 2019/0212226 A1* | 7/2019 | Wegmann | .......... G01M 11/0271 |
| 2020/0363573 A1 | 11/2020 | De Groot et al. | |
| 2021/0026250 A1 | 1/2021 | Tang et al. | |

FOREIGN PATENT DOCUMENTS

| | | | | |
|---|---|---|---|---|
| JP | 2018-513997 A | 5/2018 | | |
| WO | WO 2013/180187 | 12/2013 | | |
| WO | WO 2019/149467 A1 | 8/2019 | | |
| WO | WO-2019149468 A1 * | 8/2019 | ............. | G03F 7/706 |

* cited by examiner

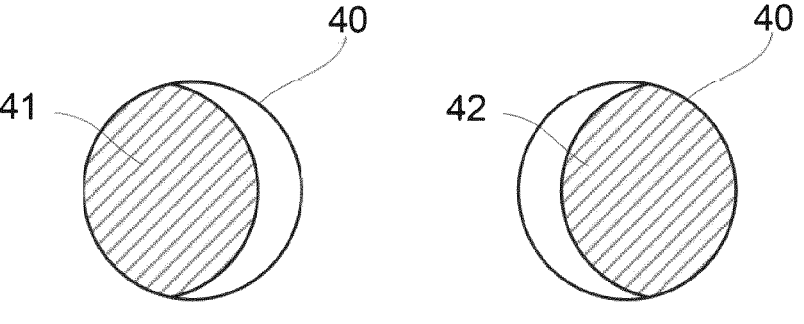
FIG. 11A                    FIG. 11B

MEASUREMENT SYSTEM AND METHOD OF USE

CROSS-REFERENCE TO RELATED APPLICATIONS

This application claims priority of EP application 20207351.6 which was filed on Nov. 13, 2020 and which is incorporated herein in its entirety by reference.

FIELD

The present invention relates to a measurement system and method of use. More particularly, the method may be for determining optical aberrations for a projection system or measuring alignment.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Radiation that has been patterned by the patterning device is focused onto the substrate using a projection system. The projection system may introduce optical aberrations, which cause the image formed on the substrate to deviate from a desired image (for example a diffraction limited image of the patterning device). Alignment in a lithographic apparatus is also an important aspect, e.g. to make sure the desired image is positioned in the correct position.

It may be desirable to provide methods and apparatus for accurately determining such aberrations caused by a projection system such that these aberrations can be better controlled. Furthermore, it may be desirable to provide methods and apparatus for accurately determining alignment in a lithographic apparatus.

SUMMARY

According to a first aspect of the invention, there is provided a measurement system, the measurement system comprising: a sensor apparatus; an illumination system arranged to illuminate the sensor apparatus with radiation, the sensor apparatus comprising a patterned region arranged to receive a radiation beam and to form a plurality of diffraction beams, the diffraction beams being separated in a shearing direction; the sensor apparatus comprising a radiation detector; wherein the patterned region is arranged such that at least some of the diffraction beams form interference patterns on the radiation detector; wherein the sensor apparatus comprises a plurality of patterned regions, and wherein pitches of the patterned regions are different in adjacent patterned regions.

This has an advantage of increasing the amount of data collected in a single measurement. Advantageously, signals corresponding to the adjacent patterned regions can be distinguished without requiring a particular spatial separation between the adjacent patterned regions.

The measurement system may be arranged such that the interference patterns from adjacent patterned regions at least partially overlap at the radiation detector.

The pitches of alternating patterned regions may be the same.

The pitches of the adjacent patterned regions may not be even number integer multiples.

The pitches of the adjacent patterned regions may not be integer multiples.

The plurality of patterned regions may comprise thirteen patterned regions.

The plurality of patterned regions may be positioned at odd and even field point locations.

The plurality of patterned regions may extend in an x direction and in a second direction orthogonal to the x direction.

The measurement system may further comprise: a patterning device; wherein the illumination system is arranged to illuminate the patterning device with radiation, the patterning device comprising a first patterned region arranged to receive the radiation beam and to form a plurality of first diffraction beams, the first diffraction beams being separated in the shearing direction; wherein the patterned region of the sensor apparatus comprises a second patterned region; the projection system being configured to project the first diffraction beams onto the sensor apparatus, the second patterned region being arranged to receive the first diffraction beams from the projection system and to form a plurality of second diffraction beams from each of the first diffraction beams such that the first and second patterned regions form a set; wherein the first and second patterned regions in the set are matched by matching the pitches of the first and second patterned regions in the shearing direction such that at least some of the second diffraction beams formed from at least one of the first diffraction beams are spatially coherent with a second diffraction beam formed from at least one other first diffraction beam to form interference patterns on the radiation detector; wherein the patterning device comprises a plurality of first patterned regions and the sensor apparatus comprises a plurality of second patterned regions such that there is a plurality of sets, each set comprising one of the plurality of first patterned regions and one of the plurality of second patterned regions, and wherein the pitches of the first patterned regions are different in adjacent sets and/or the pitches of the second patterned regions are different in adjacent sets.

The pitches of the first patterned regions and the second patterned regions in at least one of the plurality of sets may be the same.

The measurement system may further comprise a positioning apparatus configured to move at least one of the patterning device and the sensor apparatus in the shearing direction; and a controller configured to: control the positioning apparatus so as to move at least one of the first patterning device and the sensor apparatus in the shearing direction such that an intensity of radiation received by each part of the radiation detector varies as a function of the movement in the shearing direction so as to form oscillating signals corresponding to the different pitches of the first patterned regions in adjacent sets and/or the different pitches of the second patterned regions in adjacent sets; determine from the radiation detector phases of harmonics of the oscillating signals at a plurality of positions on the radiation detector; and determine a set of coefficients that characterize an aberration map of the projection system from the phase of the harmonics of the oscillating signals at the plurality of positions on the radiation detector.

The set of coefficients that characterize the aberration map of the projection system may be determined by equating the phases of the harmonics of the oscillating signals to a difference in the aberration map between positions in the pupil plane that are separated in the shearing direction by twice a shearing distance which corresponds to the distance in the pupil plane between two adjacent first diffraction beams and solving to find the set of coefficients.

The set of coefficients that characterize the aberration map of the projection system may be determined by simultaneously solving constraints for the shearing direction and for a second, orthogonal direction.

The plurality of first patterned regions and the plurality of second patterned regions may be gratings.

A lithographic apparatus comprising the measurement system as described above.

According to a second aspect of the present invention, there is provided a method for measurement, the method comprising: illuminating a sensor apparatus with radiation, wherein the sensor apparatus comprises a patterned region arranged to receive at least a portion of the radiation and to form a plurality of diffraction beams, the diffraction beams being separated in a shearing direction; wherein the sensor apparatus comprises a radiation detector arranged to receive at least a portion of the diffraction beams, wherein the patterned region is arranged such that at least some of the diffraction beams form interference patterns on the radiation detector; wherein the sensor apparatus comprises a plurality of patterned regions, and wherein pitches of the patterned regions are different in adjacent patterned regions.

The method may further comprise: illuminating a patterning device with radiation, wherein the patterning device comprises a first patterned region arranged to receive at least a portion of the radiation and to form a plurality of first diffraction beams, the first diffraction beams being separated in the shearing direction; projecting, with the projection system, at least part of the plurality of first diffraction beams onto the sensor apparatus comprising: the patterned region comprising a second patterned region arranged to receive the first diffraction beams from the projection system and to form a plurality of second diffraction beams from each of the first diffraction beams; and a radiation detector arranged to receive at least a portion of the second diffraction beams, wherein the first and second patterned regions in the set are matched by matching the pitches of the first and second patterned regions in the shearing direction such that at least some of the second diffraction beams formed from at least one of the first diffraction beams are spatially coherent with a second diffraction beam formed from at least one other first diffraction beam to form interference patterns on the radiation detector; wherein the patterning device comprises a plurality of first patterned regions and the sensor apparatus comprises a plurality of second patterned regions such that there is a plurality of sets, each set comprising one of the plurality of first patterned regions and one of the plurality of second patterned regions, and wherein the pitches of the first patterned regions are different in adjacent sets and/or the pitches of the second patterned regions are different in adjacent sets.

The method may further comprise moving at least one of the patterning device and the sensor apparatus in the shearing direction such that an intensity of radiation received by each part of the radiation detector varies as a function of the movement in the shearing direction so as to form a plurality of oscillating signals corresponding to the different pitches of the first patterned regions in adjacent sets and/or the different pitches of the second patterned regions in adjacent sets; determining from the radiation detector phases of harmonics of the oscillating signals at a plurality of positions on the radiation detector; and determining a set of coefficients that characterize an aberration map of the projection system from the phase of the harmonics of the oscillating signals at the plurality of positions on the radiation detector.

The method may further comprise determining the set of coefficients that characterize the aberration map of the projection system by equating the phases of the harmonics of the oscillating signals to a difference in the aberration map between positions in the pupil plane that are separated in the shearing direction by twice a shearing distance which corresponds to the distance in the pupil plane between two adjacent first diffraction beams and solving to find the set of coefficients.

The method may further comprise determining the set of coefficients that characterize the aberration map of the projection system by simultaneously solving constraints for the shearing direction and for a second, orthogonal direction.

The method may further comprise moving the at least one of the patterning device and the sensor apparatus in the shearing direction in phase steps in a range of 4-9 to form the plurality of oscillating signals.

According to a third aspect of the present invention, there is provided a computer readable medium carrying a computer program comprising computer readable instructions configured to cause a computer to carry out a method as described above.

According to a fourth aspect of the present invention, there is provided a computer apparatus comprising: a memory storing processor readable instructions, and a processor arranged to read and execute instructions stored in said memory, wherein said processor readable instructions comprise instructions arranged to control the computer to carry out the method as described above.

BRIEF DESCRIPTION OF THE DRAWINGS

Embodiments of the invention will now be described, by way of example only, with reference to the accompanying schematic drawings, in which:

FIG. 11A shows a portion of the radiation detector of the measurement system shown in FIG. 4 which corresponds to the numerical aperture of the projection system of the measurement system and which represents the overlap between the second diffraction beams shown in FIGS. 8B and 9A and the overlap between the second diffraction beams shown in FIGS. 8A and 10B;

FIG. 11B shows a portion of the radiation detector of the measurement system shown in FIG. 4 which corresponds to the numerical aperture of the projection system of the measurement system and which represents the overlap between the second diffraction beams shown in FIGS. 8B and 10C and the overlap between the second diffraction beams shown in FIGS. 8C and 9B;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
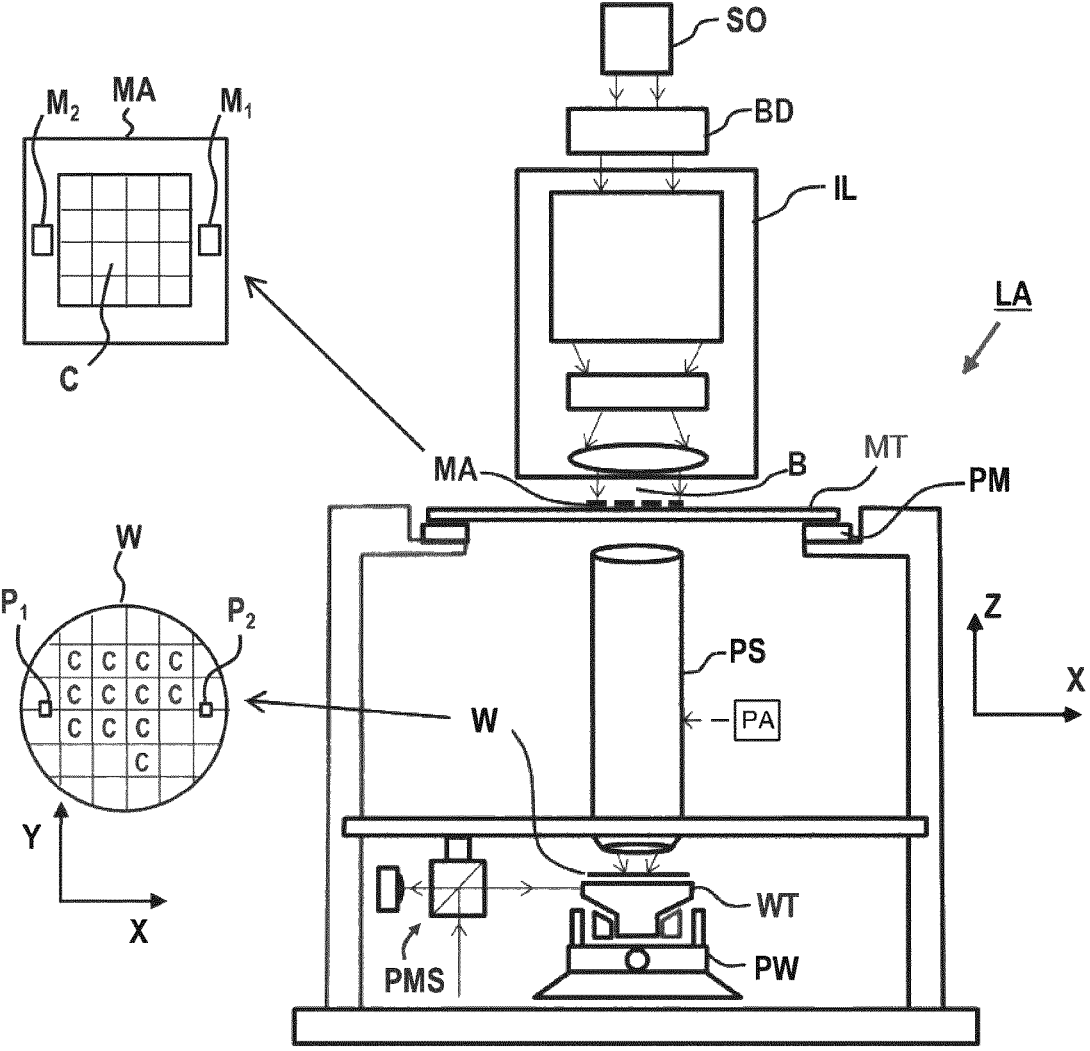
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In general, the projection system PS has an optical transfer function which may be non-uniform, which can affect the pattern which is imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be obtained from a measured scalar map by calculating the inner product of the measured scalar map with each Zernike polynomial in turn and dividing this by the square of the norm of that Zernike polynomial. In the following, unless stated otherwise, any reference to Zernike coefficients will be understood to mean the Zernike coefficients of a relative phase map (also referred to herein as an aberration map). It will be appreciated that in alternative examples other sets of basis functions may be used. For example some examples may use Tatian Zernike polynomials, for example for obscured aperture systems.

The wavefront aberration map represents the distortions of the wavefront of light approaching a point in an image plane of the projection system PS from a spherical wavefront (as a function of position in the pupil plane or, alternatively, the angle at which radiation approaches the image plane of the projection system PS). As discussed, this wavefront aberration map $W(x,y)$ may be expressed as a linear combination of Zernike polynomials:

$$W(x, y) = \sum_{n} c_n \cdot Z_n(x, y) \tag{1}$$

where x and y are coordinates in the pupil plane, $Z_n(x,y)$ is the nth Zernike polynomial and c, is a coefficient. It will be appreciated that in the following, Zernike polynomials and coefficients are labelled with an index which is commonly referred to as a Noll index. Therefore, $Z_n(x,y)$ is the Zernike polynomial having a Noll index of n and $c_n$ is a coefficient having a Noll index of n. The wavefront aberration map may then be characterized by the set of coefficients $c_n$ in such an expansion, which may be referred to as Zernike coefficients.

It will be appreciated that only a finite number of Zernike orders are taken into account. Different Zernike coefficients of the phase map may provide information about different forms of aberration which are caused by the projection system PS. The Zernike coefficient having a Noll index of 1 may be referred to as the first Zernike coefficient, the Zernike coefficient having a Noll index of 2 may be referred to as the second Zernike coefficient and so on.

The first Zernike coefficient relates to a mean value (which may be referred to as a piston) of a measured wavefront. The first Zernike coefficient may be irrelevant to the performance of the projection system PS and as such may not be determined using the methods described herein. The second Zernike coefficient relates to the tilt of a measured wavefront in the x-direction. The tilt of a wavefront in the x-direction is equivalent to a placement in the x-direction. The third Zernike coefficient relates to the tilt of a measured wavefront in the y-direction. The tilt of a wavefront in the y-direction is equivalent to a placement in the y-direction. The fourth Zernike coefficient relates to a defocus of a measured wavefront. The fourth Zernike coefficient is equivalent to a placement in the z-direction. Higher order Zernike coefficients relate to other forms of aberration which are caused by the projection system (e.g. astigmatism, coma, spherical aberrations and other effects).

Throughout this description the term "aberrations" should be intended to include all forms of deviation of a wavefront from a perfect spherical wavefront. That is, the term "aberrations" may relate to the placement of an image (e.g. the second, third and fourth Zernike coefficients) and/or to higher order aberrations such as those which relate to Zernike coefficients having a Noll index of 5 or more. Furthermore, any reference to an aberration map for a projection system may include all forms of deviation of a wavefront from a perfect spherical wavefront, including those due to image placement.

The transmission map and the relative phase map are field and system dependent. That is, in general, each projection system PS will have a different Zernike expansion for each field point (i.e. for each spatial location in its image plane).

As will be described in further detail below, the relative phase of the projection system PS in its pupil plane may be determined by projecting radiation from an object plane of the projection system PS (i.e. the plane of the patterning device MA), through the projection system PS and using a shearing interferometer to measure a wavefront (i.e. a locus of points with the same phase). The shearing interferometer may comprise a diffraction grating, for example a two dimensional diffraction grating, in an image plane of the projection system (i.e. the substrate table WT) and a detector arranged to detect an interference pattern in a plane that is conjugate to a pupil plane of the projection system PS.

The projection system PS comprises a plurality of optical elements (including lenses). The projection system PS may include a number of lenses (e.g. one, two, six or eight lenses). The lithographic apparatus LA further comprises adjusting means PA for adjusting these optical elements so as to correct for aberrations (any type of phase variation across the pupil plane throughout the field). To achieve this, the adjusting means PA may be operable to manipulate optical elements within the projection system PS in one or more different ways. The projection system may have a co-ordinate system wherein its optical axis extends in the z direction (it will be appreciated that the direction of this z axis changes along the optical path through the projection system, for example at each lens or optical element). The adjusting means PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric optical elements. Deformation of an optical element may be performed for example by using actuators to exert force on sides of the optical element and/or by using heating elements to heat selected regions of the optical element. In general, it may not be possible to adjust the projection system PS to correct for apodizations (transmission variation across the pupil plane). The transmission map of a projection system PS may be used when designing masks MAs for the lithographic apparatus LA.

In some examples, the adjusting means PA may be operable to move the support structure MT and/or the substrate table WT. The adjusting means PA may be operable to displace (in any of the x, y, z directions or a combination thereof) and/or tilt (by rotating about axes in the x or y directions) the support structure MT and/or the substrate table WT.

A projection system PS which forms part of a lithographic apparatus may periodically undergo a calibration process. For example, when a lithographic apparatus is manufactured in a factory the optical elements (e.g. lenses) which form the projection system PS may be set up by performing an initial calibration process. After installation of a lithographic apparatus at a site at which the lithographic apparatus is to be used, the projection system PS may once again be calibrated. Further calibrations of the projection system PS may be performed at regular intervals. For example, under normal use the projections system PS may be calibrated every few months (e.g. every three months).

Calibrating a projection system PS may comprise passing radiation through the projection system PS and measuring the resultant projected radiation. Measurements of the projected radiation may be used to determine aberrations in the projected radiation which are caused by the projection system PS. Aberrations which are caused by the projection system PS may be determined using a measurement system. In response to the determined aberrations, the optical elements which form the projection system PS may be adjusted so as to correct for the aberrations which are caused by the projection system PS.

Figure 2:
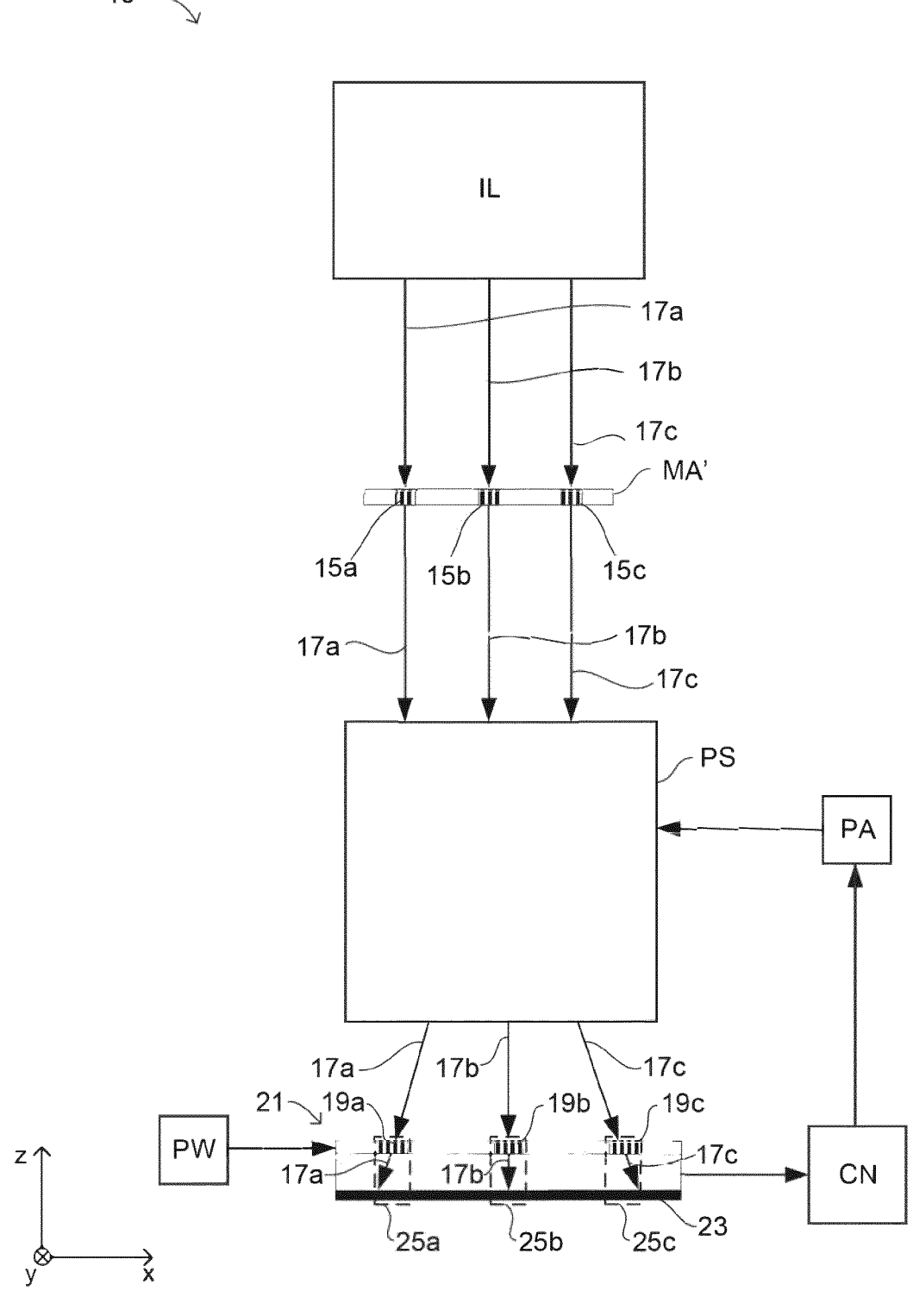
FIG. 2 is a schematic illustration of a measurement system according to an example.

FIG. 2 is a schematic illustration of a measurement system 10 which may be used to determine aberrations which are caused by a projection system PS. The measurement system 10 comprises an illumination system IL, a measurement patterning device MA', a sensor apparatus 21 and a controller CN. The measurement system 10 may form part of a lithographic apparatus. For example, the illumination system IL and the projection system PS which are shown in FIG. 2 may be the illumination system IL and projection system PS of the lithographic apparatus which is shown in FIG. 1. For ease of illustration additional components of a lithographic apparatus are not shown in FIG. 2.

The measurement patterning device MA' is arranged to receive radiation from the illumination system IL. The sensor apparatus 21 is arranged to receive radiation from the projection system PS. During normal use of a lithographic apparatus, the measurement patterning device MA' and the sensor apparatus 21 which are shown in FIG. 2 may be located in positions that are different to the positions in which they are shown in FIG. 2. For example, during normal use of a lithographic apparatus a patterning device MA which is configured to form a pattern to be transferred to a substrate W may be positioned to receive radiation from the illumination system IL and a substrate W may be positioned to receive radiation from the projection system PS (as is shown, for example, in FIG. 1). The measurement patterning device MA' and the sensor apparatus 21 may be moved into the positions in which they are shown in FIG. 2 in order to determine aberrations which are caused by the projection system PS. The measurement patterning device MA' may be supported by a support structure MT, such as the support structure which is shown in FIG. 1. The sensor apparatus 21 may be supported by a substrate table, such as the substrate table WT which is shown in FIG. 1. Alternatively the sensor apparatus 21 may be supported by a measurement table (not shown) which may be separate to the sensor table WT.

Figure 3A:
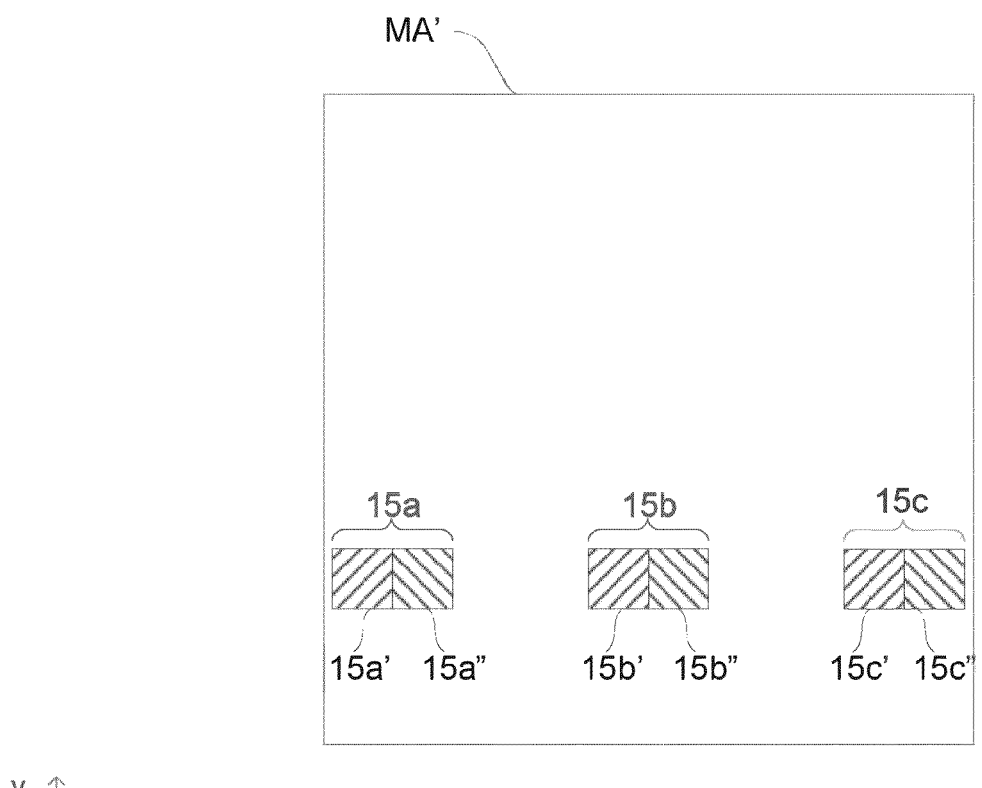
FIGS. 3A and 3B are schematic illustrations of a patterning device and a sensor apparatus which may form part of the measurement system of FIG. 2.
Figure 3B:
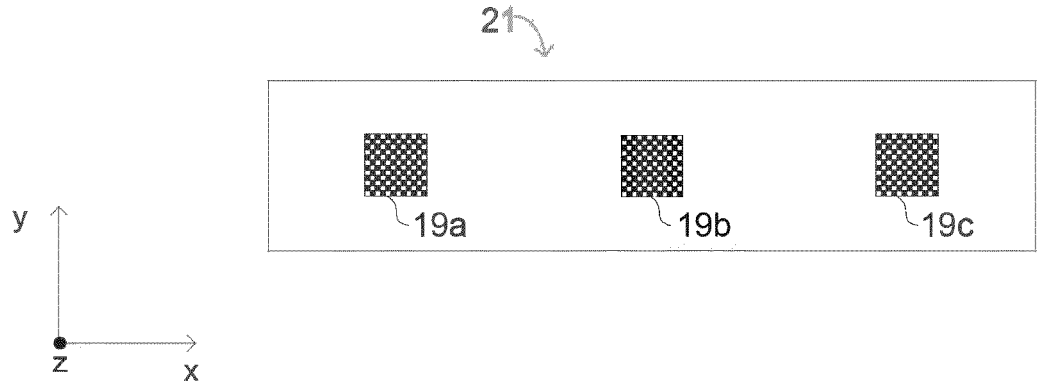

The measurement patterning device MA' and the sensor apparatus 21 are shown in more detail in FIGS. 3A and 3B. Cartesian co-ordinates are used consistently in FIGS. 2, 3A and 3B. FIG. 3A is a schematic illustration of the measurement patterning device MA' in an x-y plane and FIG. 3B is a schematic illustration of the sensor apparatus 21 in an x-y plane.

The measurement patterning device MA' comprises a plurality of patterned regions 15a-15c. In the example which is shown in FIGS. 2 and 3A the measurement patterning device MA' is a transmissive patterning device MA'. The patterned regions 15a-15c each comprises a transmissive diffraction grating. Radiation which is incident on the patterned regions 15a-15c of the measurement patterning device MA' is at least partially scattered thereby and received by the projection system PS. In contrast, radiation which is incident on the remainder of the measurement patterning device MA' is not transmitted or scattered towards the projection system PS (for example, it may be absorbed by the measurement patterning device MA').

The illumination system IL illuminates the measurement patterning device MA' with radiation. Whilst not shown in FIG. 2, the illumination system IL may receive radiation from a radiation source SO and condition the radiation so as to illuminate the measurement patterning device MA'. For example, the illumination system IL may condition the radiation so as to provide radiation having a desired spatial and angular distribution. In the example which is shown in FIG. 2, the illumination system IL is configured to form separate measurement beams 17a-17c. Each measurement beam 17a-17c illuminates a respective patterned region 15a-15c of the measurement patterning device MA'.

In order to perform a determination of aberrations which are caused by the projection system PS, a mode of the illumination system IL may be changed in order to illuminate the measurement patterning device MA' with separate measurement beams 17a-17c. For example, during normal operation of a lithographic apparatus, the illumination system IL may be configured to illuminate a patterning device MA with a slit of radiation. However the mode of the illumination system IL may be changed such that the illumination system IL is configured to form separate measurement beams 17a-17c in order to perform a determination of aberrations caused by the projection system PS. In some examples different patterned regions 15a-15c may be illuminated at different times. For example, a first subset of the patterned regions 15a-15c may be illuminated at a first time so as to form a first subset of measurement beams 17a-17c and a second subset of patterned regions 15a-15c may be illuminated at a second time so as to form a second subset of measurement beams 17a-17c.

In other examples the mode of the illumination system IL may be unchanged in order to perform a determination of aberrations caused by the projection system PS. For example, the illumination system IL may be configured to illuminate the measurement patterning device MA' with a slit of radiation (e.g. which substantially corresponds with an illumination area used during exposure of substrates). Separate measurement beams 17a-17c may then be formed by the measurement patterning device MA' since only the patterned regions 15a-15c transmit or scatter radiation towards the projection system PS.

In the Figures the Cartesian co-ordinate system is shown as being conserved through the projection system PS. However, in some examples the properties of the projection system PS may lead to a transformation of the co-ordinate system. For example, the projection system PS may form an image of the measurement patterning device MA' which is magnified, rotated and/or mirrored relative to the measurement patterning device MA'. In some examples the projection system PS may rotate an image of the measurement patterning device MA' by approximately 180° around the z-axis. In such an example the relative positions of a first measurement beam 17a and a third measurement beam 17c which are shown in FIG. 2, may be swapped. In other examples the image may be mirrored about an axis which may lie in an x-y plane. For example, the image may be mirrored about the x-axis or about the y-axis.

In examples in which the projection system PS rotates an image of the measurement patterning device MA' and/or the image is mirrored by the projection system PS, the projection system is considered to transform the co-ordinate system. That is, the co-ordinate system which is referred to herein is defined relative to an image which is projected by the projection system PS and any rotation and/or mirroring of the image causes a corresponding rotation and/or mirroring of the co-ordinate system. For ease of illustration, the co-ordinate system is shown in the Figures as being conserved by the projection system PS. However, in some examples the co-ordinate system may be transformed by the projection system PS.

The patterned regions 15a-15c modify the measurement beams 17a-17c. In particular, the patterned regions 15a-15c cause a spatial modulation of the measurement beams 17a-17c and cause diffraction in the measurement beams 17a-17c. In the example which is shown in FIG. 3B the patterned regions 15a-15c each comprise two distinct portions. For example, a first patterned region 15a comprises a first portion 15a' and a second portion 15a". The first portion 15a' comprises a diffraction grating which is aligned parallel to a u-direction and the second portion 15a" comprises a diffraction grating which is aligned parallel to a v-direction. The u and v-directions are depicted in FIG. 3A. The u and v-directions are both aligned at approximately 45° relative to both the x and y-directions and are aligned perpendicular to each other. Second 15b and third 15c patterned regions which are shown in FIG. 3A are identical to the first patterned region 15a and each comprise first and second portions whose diffraction gratings are aligned perpendicular to each other.

The first and second portions of the patterned regions 15a-15c may be illuminated with the measurement beams 17a-17c at different times. For example, the first portions of each of the patterned regions 15a-15c may be illuminated by the measurement beams 17a-17c at a first time. At a second time the second portions of each of the patterned regions 15a-15c may be illuminated by the measurement beams 17a-17c. As was mentioned above in some examples different patterned regions 15a-15c may be illuminated at different times. For example, the first portions of a first subset of patterned regions 15a-15c may be illuminated at a first time and the first portions of a second subset of patterned regions 15a-15c may be illuminated at a second time. Second portions of the first and second subsets of patterned regions may be illuminated at the same or different times. In general any schedule of illuminating different portions of patterned regions 15a-15c may be used.

The modified measurement beams 17a-17c are received by the projection system PS. The projection system PS forms an image of the patterned regions 15a-15c on the sensor apparatus 21. The sensor apparatus 21 comprises a plurality of diffraction gratings 19a-19c and a radiation detector 23. The diffraction gratings 19a-19c are arranged such that each diffraction grating 19a-19c receives a respective modified measurement beam 17a-17c which is output from the projection system PS. The modified measurement beams 17a-17c which are incident on the diffraction gratings 19a-19c are further modified by the diffraction gratings 19a-19c. The modified measurement beams which are transmitted at the diffraction gratings 19a-19c are incident on the radiation detector 23.

The radiation detector 23 is configured to detect the spatial intensity profile of radiation which is incident on the radiation detector 23. The radiation detector 23 may, for example, comprise an array of individual detector elements or sensing elements. For example, the radiation detector 23 may comprise an active pixel sensor such as, for example, a CMOS (complementary metal-oxide-semiconductor) sensor array. Alternatively, the radiation detector 23 may comprise a CCD (charge-coupled device) sensor array. The diffraction gratings 19a-19c and portions of the radiation sensor 23 at which the modified measurement beams 17a-17c are received form detector regions 25a-25c. For example, a first diffraction grating 19a and a first portion of the radiation sensor 23 at which a first measurement beam 17a is received together form a first detector region 25a. A measurement of a given measurement beam 17a-17c may be made at a respective detector region 25a-25c (as depicted). As described above, in some examples the relative positioning of the modified measurement beams 17a-17c and the co-ordinate system may be transformed by the projection system PS.

The modification of the measurement beams 17a-17c which occurs at the patterned regions 15a-15c and the diffraction gratings 19a-19c of the detector regions 25a-25c results in interference patterns being formed on the radiation detector 23. The interference patterns are related to the derivative of the phase of the measurement beams and depend on aberrations caused by the projection system PS. The interference patterns may therefore be used to determine aberrations which are caused by the projection system PS.

In general, the diffraction gratings 19a-19c of each of the detector regions 25a-25c comprises a two-dimensional transmissive diffraction grating. In the example which is shown in FIG. 3B the detector regions 25a-25c each comprise a diffraction grating 19a-19c which is configured in the form of a checkerboard.

Illumination of the first portions of the patterned regions 15a-15c may provide information related to aberrations in a first direction and illumination of the second portions of the patterned regions 15a-15c may provide information related to aberrations in a second direction.

In some examples, the measurement patterning device MA' and/or the sensor apparatus 21 is sequentially scanned and/or stepped in two perpendicular directions. For example, the measurement patterning device MA' and/or the sensor apparatus 21 may be stepped relative to each other in the u and v-directions. The measurement patterning device MA' and/or the sensor apparatus 21 may be stepped in the u-direction whilst the second portions 15a"-15c" of the patterned regions 15a-15c are illuminated and the measurement patterning device MA' and/or the sensor apparatus 21 may be stepped in the v-direction whilst the first portions 15a'-15c' of the patterned regions 15a-15c are illuminated. That is, the measurement patterning device MA' and/or the sensor apparatus 21 may be stepped in a direction which is perpendicular to the alignment of a diffraction grating which is being illuminated.

The measurement patterning device MA' and/or the sensor apparatus 21 may be stepped by distances which correspond with a fraction of the grating period of the diffraction gratings. Measurements which are made at different stepping positions may be analysed in order to derive information about a wavefront in the stepping direction. For example, the phase of the first harmonic of the measured signal (which may be referred to as a phase stepping signal) may contain information about the derivative of a wavefront in the stepping direction. Stepping the measurement patterning device MA' and/or the sensor apparatus 21 in both the u and v-directions (which are perpendicular to each other) therefore allows information about a wavefront to be derived in two perpendicular directions (in particular, it provides information about a derivative of the wavefront in each of the two perpendicular directions), thereby allowing the full wavefront to be reconstructed.

In addition to stepping of the measurement patterning device MA' and/or the sensor apparatus 21 in a direction which is perpendicular to the alignment of a diffraction grating which is being illuminated (as was described above), the measurement patterning device MA' and/or the sensor apparatus 21 may also be scanned relative to each other. Scanning of the measurement patterning device MA' and/or the sensor apparatus 21 may be performed in a direction which is parallel to the alignment of a diffraction grating which is being illuminated. For example, the measurement patterning device MA' and/or the sensor apparatus 21 may be scanned in the u-direction whilst the first portions 15a'-15c' of the patterned regions 15a-15c are illuminated and the measurement patterning device MA' and/or the sensor apparatus 21 may be scanned in the v-direction whilst the second portions 15a"-15c" of the patterned regions 15a-15c are illuminated. Scanning of the measurement patterning device MA' and/or the sensor apparatus 21 in a direction which is parallel to the alignment of a diffraction grating which is being illuminated allows measurements to be averaged out across the diffraction grating, thereby accounting for any variations in the diffraction grating in the scanning direction. Scanning of the measurement patterning device MA' and/or the sensor apparatus 21 may be performed at a different time to the stepping of the measurement patterning device MA' and/or the sensor apparatus 21 which was described above.

It will be appreciated that a variety of different arrangements of the patterned regions 15a-15c and the detector regions 25a-25c may be used in order to determine aberrations caused by the projection system PS. The patterned regions 15a-15c and/or the detector regions 25a-25c may comprise diffraction gratings. In some examples the patterned regions 15a-15c and/or the detector regions 25a-25c may comprise components other than a diffraction grating. For example, in some examples the patterned regions 15a-15c and/or the detector regions may comprise a single slit or a pin-hole opening through which at least a portion of a measurement beam 17a-17c may propagate. In general the patterned regions and/or the detector regions may comprise any arrangement which serves to modify the measurement beams.

The controller CN receives measurements made at the sensor apparatus 21 and determines, from the measurements, aberrations which are caused by the projection system PS. The controller may be configured to control one or more components of the measurement system 10. For example, the controller CN may control a positioning apparatus PW which is operable to move the sensor apparatus 21 and/or the measurement patterning device MA' relative to each other. The controller may control an adjusting means PA for adjusting components of the projection system PS. For example, the adjusting means PA may adjust optical elements of the projection system PS so as to correct for aberrations which are caused by the projection system PS and which are determined by the controller CN.

In some examples, the controller CN may be operable to control the adjusting means PA for adjusting the support structure MT and/or the substrate table WT. For example, the adjusting means PA may adjust support structure MT and/or substrate table WT so as to correct for aberrations which are caused by placement errors of patterning device MA and/or substrate W (and which are determined by the controller CN).

Determining aberrations (which may be caused by the projection system PS or by placement errors of the patterning device MA or the substrate W) may comprise fitting the measurements which are made by the sensor apparatus 21 to Zernike polynomials in order to obtain Zernike coefficients. Different Zernike coefficients may provide information about different forms of aberration which are caused by the projection system PS. Zernike coefficients may be determined independently at different positions in the x and/or the y-directions. For example, in the example which is shown in FIGS. 2, 3A and 3B, Zernike coefficients may be determined for each measurement beam 17a-17c.

Whilst, in the example which is shown in FIGS. 2, 3A and 3B the measurement patterning device MA' comprises three patterned regions 15a-15c and the sensor apparatus 21 comprises three detector regions 25a-25c, in other examples the measurement patterning device MA' may comprise more or less than three patterned regions 15a-15c and/or the sensor apparatus 21 may comprise more or less than three detector regions 25a-25c.

Methods for determining aberrations caused by a projection system PS are now described with reference to FIG. 4.

In general, measurement patterning device MA' comprises at least one first patterned region 15a-15c and the sensor apparatus 21 comprises at least one second patterned region 19a-19c.

Figure 4:
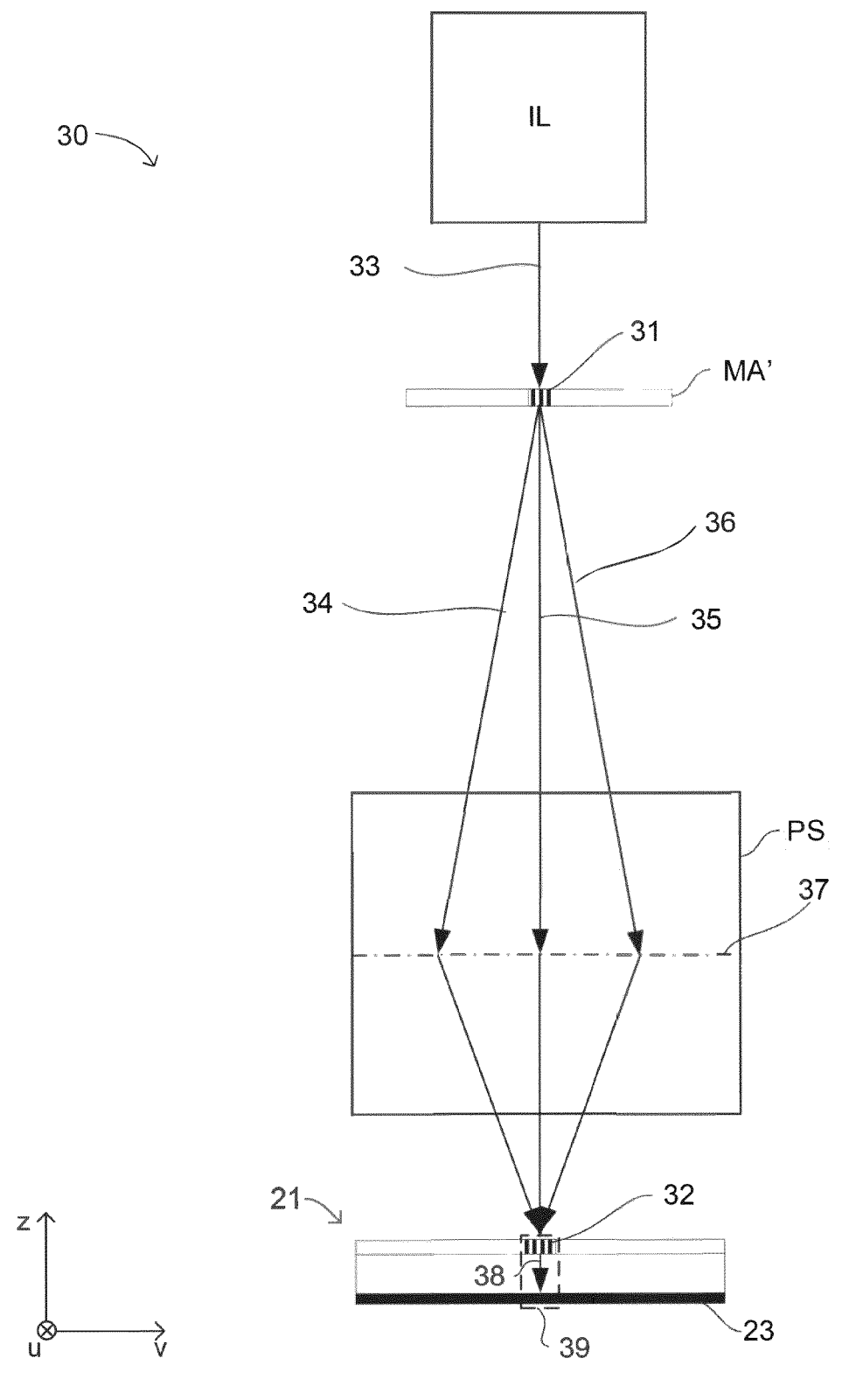
FIG. 4 is a schematic illustration of a measurement system according to an example, the measurement system comprising a first patterned region and a second patterned region, the first patterned region arranged to receive radiation and to form a plurality of first diffraction beams.

FIG. 4 is a schematic illustration of a measurement system 30 which may be used to determine aberrations which are caused by a projection system PS. Measurement system 30 may be the same as the measurement system 10 shown in FIG. 2, however, it may have a different number of first patterned regions (on measurement patterning device MA') and second patterned regions (in the sensor apparatus 21). Therefore, the measurement system 30 shown in FIG. 4 may include any features of the measurement system 10 shown in FIG. 2 described above and these features will not be further described below.

In FIG. 4, only a single first patterned region 31 is provided on the measurement patterning device MA' and a single second patterned region 32 is provided in the sensor apparatus 21.

The measurement patterning device MA' is irradiated with radiation 33 from the illumination system IL. For ease of understanding only a single line (which may, for example, represent a single ray, for example the chief ray, of an incident radiation beam) is shown in FIG. 4. However, it will be appreciated that the radiation 33 will comprise a range of angles incident on the first patterned region 31 of the measurement patterning device MA'. That is, each point on the first patterned region 31 of the measurement patterning device MA' may be illuminated by a cone of light. In general, each point is illuminated by substantially the same range of angles, this being characterized by the intensity of radiation in a pupil plane of the illumination system IL (not shown).

The first patterned region 31 is arranged to receive the radiation 33 and to form a plurality of first diffraction beams 34, 35, 36. A central first diffraction beam 35 corresponds to a $0^{th}$ order diffraction beam of first patterned region 31 and the other two first diffraction beams 34, 36 correspond to the $\pm 1^{st}$ order diffraction beams of first patterned region 31. It will be appreciated that more, higher order diffraction beams will, in general, also be present. Again for ease of understanding, only three first diffraction beams 34, 35, 36 are shown in FIG. 4.

It will also be appreciated that, as the incoming radiation 33 comprises a cone of radiation converging on a point on the first patterned region 31, each of the first diffraction beams 34, 35, 36 also comprises a cone of radiation diverging from that point on the first patterned region 31.

To achieve the generation of the first diffraction beams 34, 35, 36, the first patterned region 31 may be of the form of a diffraction grating. For example, the first patterned region 31 may be generally of the form of the patterned region 15a shown in FIG. 3A. In particular, at least a portion of the first patterned region 31 may be of the form of the first portion 15a' of the patterned region 15a shown in FIG. 3A, i.e. a diffraction grating which is aligned parallel to a u-direction (note that FIG. 4 is shown in the z-v plane). Therefore, the first diffraction beams 34-36 are separated in a shearing direction, which is the v-direction.

The first diffraction beams 34-36 are at least partially captured by the projection system PS, as now described. How much of the first diffraction beams 34-36 is captured by the projection system PS will be dependent on: the pupil fill of the incident radiation 33 from the illumination system IL; the angular separation of the first diffraction beams 34-36 (which in turn is dependent on the pitch of the first patterned region 31 and the wavelength of the radiation 33); and the numerical aperture of the projection system PS.

The measurement system 30 may be arranged such that first diffraction beam 35 that corresponds to the $0^{th}$ order diffraction beam substantially fills the numerical aperture of the projection system PS, which may be represented by a circular region of a pupil plane 37 of the projection system PS, and the first diffraction beams 34, 36 that correspond to the $\pm 1^{st}$ order diffraction beams overlap significantly with the first diffraction beam 35 that corresponds to the $0^{th}$ order diffraction beam. With such an arrangement, substantially all of the first diffraction beam 35 that corresponds to the $0^{th}$ order diffraction beam and most of the first diffraction beams 34, 36 that correspond to the $\pm 1^{st}$ order diffraction beams is captured by the projection system PS and projected onto the sensor apparatus 21. (Furthermore, with such an arrangement a large number of diffraction beams generated by the first patterned region 31 are at least partially projected onto the sensor apparatus 21).

The role of the first patterned region 31 is to introduce spatial coherence, as now discussed.

In general, two rays of radiation 33 from the illumination system IL that are incident on the same point of the measurement patterning device MA' at different angles of incidence are not coherent. By receiving the radiation 33 and forming a plurality of first diffraction beams 34, 35, 36, the first patterned region 31 may be considered to form a plurality of copies of the incident radiation cone 33 (the copies having, in general different phases and intensities). Within any one of these copies, or first diffraction beams 34, 35, 36, two rays of radiation which originate from the same point on the measurement patterning device MA' but at different scattering angles, are not coherent (due to the properties of the illumination system IL). However, for a given ray of radiation within any one of the first diffraction beams 34, 35, 36 there is a corresponding ray of radiation in each of the other first diffraction beams 34, 35, 36 that is spatially coherent with that given ray. For example, the chief rays of each of the first diffraction beams 34, 35, 36 (which correspond to the chief ray of the incident radiation 33) are coherent and could, if combined, interfere at the amplitude level.

This coherence is exploited by the measurement system 30 to determine an aberration map of the projection system PS.

The projection system PS projects part of the first diffraction beams 34, 35, 36 (which is captured by the numerical aperture of the projection system) onto the sensor apparatus 21.

In FIG. 4, the sensor apparatus 21 comprises the single second patterning region 32. As described further below (with reference to FIGS. 5A-5C), second patterned region 32 is arranged to receive these first diffraction beams 34-36 from the projection system PS and to form a plurality of second diffraction beams from each of the first diffraction beams. In order to achieve this, the second patterning region 32 comprises a two-dimensional transmissive diffraction grating. In FIG. 4, all radiation that is transmitted by the second patterning region 32 is represented as a single arrow 38. This radiation 38 is received by a detector region 39 of the radiation detector 23 and is used to determine the aberration map.

Each of the first diffraction beams 34-36 that is incident on the patterning region 32 will diffract to a plurality of second diffraction beams. Since the second patterning region 32 comprises a two-dimensional diffraction grating, from each incident first diffraction beam, a two dimensional array of secondary diffraction beams is produced (the chief rays of these secondary diffraction beams being separated in both the shearing direction (v-direction) and the direction perpendicular thereto (the u-direction). In the following, a diffraction order that is $n^{th}$ order in the shearing direction (the v-direction) and $m^{th}$ order in the non-shearing direction (the u-direction) will be referred to as the $(n,m)^{th}$ diffraction order of the second patterned region 32. In the following, where it is not important what order a second diffraction beam is in the non-shearing direction (the u-direction), the $(n,m)^{th}$ diffraction order of the second patterned region 32 may be referred to simply as the $n^{th}$ order second diffraction beam.

Figures 5A, 5B:
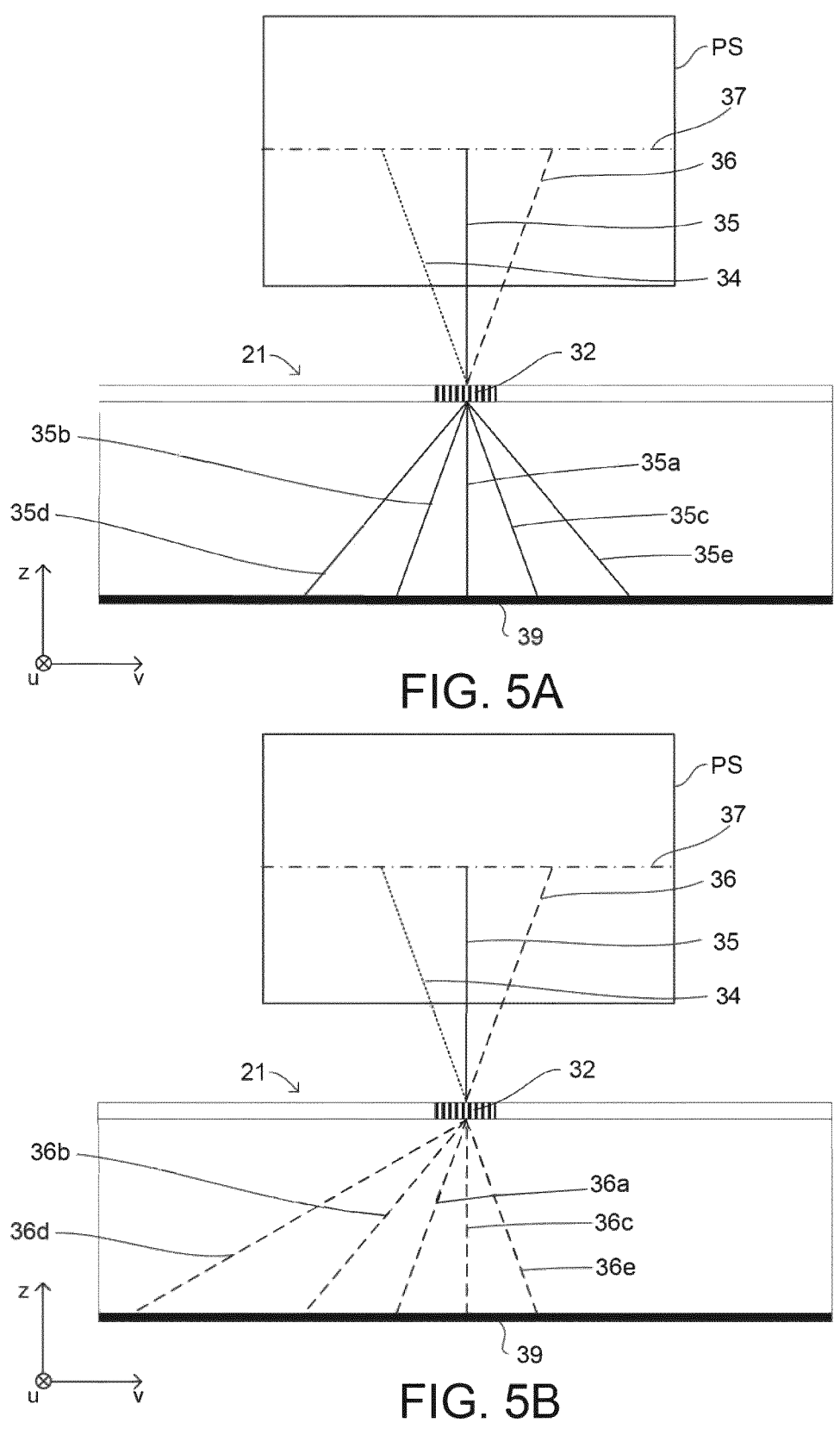
FIGS. 5A to 5C each shows a different set of second diffraction beams formed by the second patterned region of the measurement system shown in FIG. 4, that set of second diffraction beams having been produced by a different first diffraction beam formed by the first patterned region.
Figure 5C:
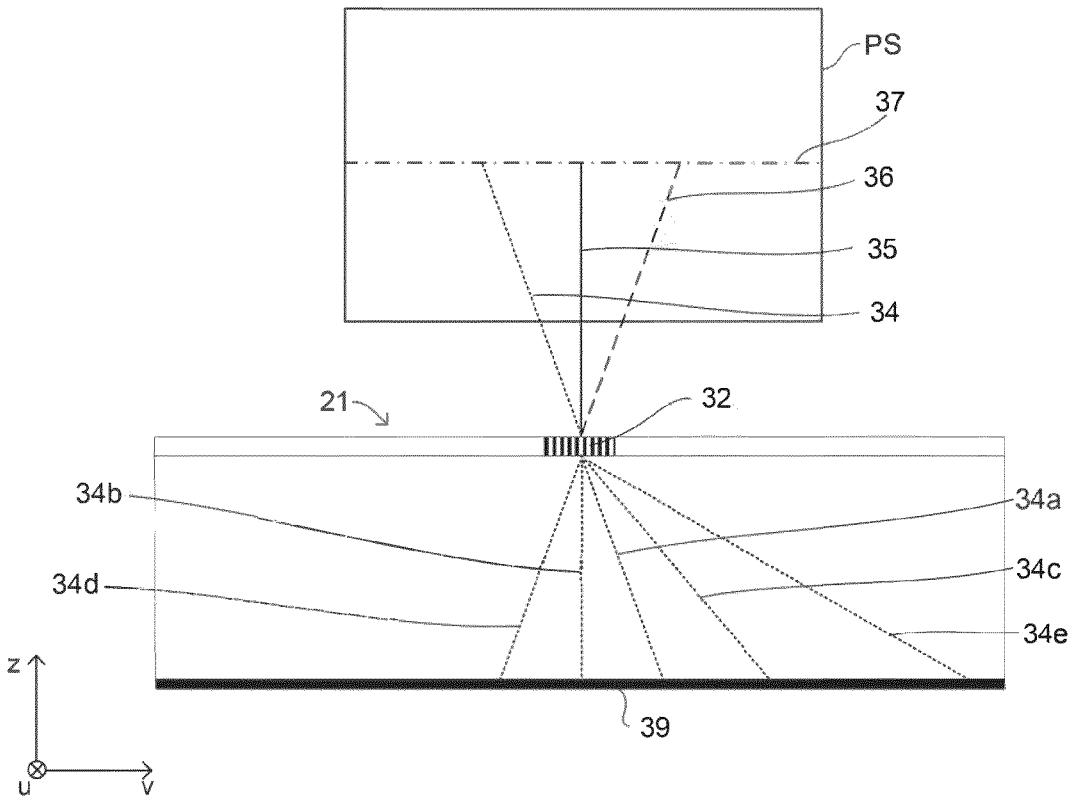

FIGS. 5A to 5C show a set of second diffraction beams produced by each of the first diffraction beams 34-36. FIG. 5A shows a set of second diffraction beams 35a-35e produced by the first diffraction beam 35 that corresponds to the $0^{th}$ order diffraction beam of first patterned region 31. FIG. 5B shows a set of second diffraction beams 36a-36e produced by the first diffraction beam 36 that corresponds to the $-1^{st}$ order diffraction beam of first patterned region 31. FIG. 5C shows a set of second diffraction beams 34a-34e produced by the first diffraction beam 34 that corresponds to the $+1^{st}$ order diffraction beam of first patterned region 31.

In FIG. 5A, second diffraction beam 35a corresponds to the $0^{th}$ order diffraction beam (of second patterned region 32, and in the shearing direction), whereas second diffraction beams 35b, 35c correspond to the $\pm1^{st}$ order diffraction beams and second diffraction beams 35d, 35e correspond to the $\pm2^{nd}$ order diffraction beams. It will be appreciated that FIGS. 5A-5C are shown in the v-z plane and the shown second diffraction beams may, for example, correspond to $0^{th}$ order diffraction beam of second patterned region 32 in the non-shearing direction (i.e. the u-direction). It will be further appreciated that there will be a plurality of copies of these second diffraction beams, representing higher order diffraction beams in the non-shearing direction that are into or out of the page of FIGS. 5A-5C.

In FIG. 5B, second diffraction beam 36a corresponds to the $0^{th}$ order diffraction beam (of second patterned region 32, and in the shearing direction), whereas second diffraction beams 36b, 36c correspond to the $\pm1^{st}$ order diffraction beams and second diffraction beams 36d, 36e correspond to the $\pm2^{nd}$ order diffraction beams.

In FIG. 5C, second diffraction beam 34a corresponds to the $0^{th}$ order diffraction beam (of second patterned region 32, and in the shearing direction), whereas second diffraction beams 34b, 34c correspond to the $\pm1^{st}$ order diffraction beams and second diffraction beams 34d, 34e correspond to the $\pm2^{nd}$ order diffraction beams.

It can be seen from FIGS. 5A-5C that several of the second diffraction beams spatially overlap with each other. For example, the second diffraction beam 35b that corresponds to the $-1^{st}$ order diffraction beam of second patterned region 32, which originates from the $0^{th}$ order diffraction beam 35 of first patterned region 31 overlaps with the second diffraction beam 36a that corresponds to the $0^{th}$ order diffraction beam of second patterned region 32, which originates from the $-1^{st}$ order diffraction beam 36 of first patterned region 31. All of the lines in FIGS. 4 and 5A-5C may be considered to represent a single ray of radiation that originates from a single input ray 33 from the illumination system IL. Therefore, as explained above, these lines represent spatially coherent rays that, if spatially overlapping at radiation detector 23 will produce an interference pattern. Furthermore, the interference is between rays which have passed though different parts of the pupil plane 37 of the projection system PS (which are separated in the shearing direction). Therefore, the interference of radiation that originates from a single input ray 33 is dependent on phase differences between two different parts of the pupil plane.

This spatial overlapping and spatial coherence of the second diffraction beams at radiation detector 23 is achieved by matching the first and second patterned regions 31, 32 such that the angular separation (in the shearing direction) between different second diffraction beams that originate from a given first diffraction beam is the same as the angular separation (in the shearing direction) between different first diffraction beams as they converge on the second patterned region 32. This spatial overlapping and spatial coherence of the second diffraction beams at radiation detector 23 is achieved by matching the pitches of the first and second patterned regions 31, 32 in the shearing direction. It will be appreciated that this matching of the pitches of the first and second patterned regions 31, 32 in the shearing direction takes into account any reduction factor applied by the projection system PS. As used herein, the pitch of a two dimensional diffraction grating in a particular direction is defined as follows.

It will be appreciated that a one-dimensional diffraction grating comprises a series of lines that are formed from a repeating pattern (of reflectivity or transmissivity) in a direction perpendicular to these lines. In the direction perpendicular to the lines, the smallest non-repeating section from which the repeating pattern is formed is referred to as the unit cell and the length of this unit cell is referred to as the pitch of the one-dimensional diffraction grating. In general, such a one-dimensional diffraction grating will have a diffraction pattern such that an incident radiation beam will be diffracted so as to form a one-dimensional array of angularly spaced (but potentially spatially overlapping) diffraction beams. The first patterned region 31 forms such a one-dimensional array of angularly spaced first diffraction beams 34-36, which are offset (angularly spaced) in the shearing direction.

It will be appreciated that a two-dimensional diffraction grating comprises a two-dimensional repeating pattern of reflectivity or transmissivity. The smallest non-repeating section from which this repeating pattern is formed may be referred to as the unit cell. The unit cell may be square and a fundamental pitch of such a two-dimensional diffraction grating may be defined as a length of the square unit cell. In general, such a two dimensional diffraction grating will have a diffraction pattern such that an incident radiation beam will be diffracted so as to form a two dimensional array of, angularly spaced (but potentially spatially overlapping) diffraction beams. The axes of this two-dimensional (square) array of diffraction beams are parallel to the sides of the unit cell. The angular separation between adjacent diffraction beams in these two directions may be given by the ratio of the wavelength of the radiation to the pitch of the grating. Therefore, the smaller the pitch, the larger the angular separation between the adjacent diffraction beams.

In some examples, the axes of the unit cell of the two-dimensional second patterned region 32 may be arranged at a non-zero angle to the shearing and non-shearing directions as defined by the first patterned region 31. For example, the axes of the unit cell of the two-dimensional second patterned region 32 may be arranged at 450 to the shearing and non-shearing directions as defined by the first patterned region 31. As previously explained, spatial overlapping and spatial coherence of the second diffraction beams at radiation detector 23 which allows the wavefront to be measured is achieved by ensuring that that the angular separation (in the shearing direction) between different second diffraction beams that originate from a given first diffraction beam is the same as the angular separation (in the shearing direction) between different first diffraction beams as they converge on the second patterned region 32. For an arrangement wherein the axes of the unit cell of the two-dimensional second patterned region 32 are arranged at a non-zero angle (for example 45°) to the shearing and non-shearing directions, it can be useful to define a pseudo-unit cell and a pseudo-pitch as follows. The pseudo-unit cell is defined as the smallest non-repeating square from which the repeating pattern of the diffraction grating is formed, which is orientated such that its sides are parallel to the shearing and non-shearing directions (as defined by the first patterned region 31. The pseudo-pitch may be defined as a length of the square pseudo-unit cell. This may be referred to as the pitch of a two dimensional diffraction grating in the shearing direction. It is this pseudo-pitch which should be matched to (an integer multiple or fraction of) the pitch of the first patterned region 31.

The diffraction pattern of the diffraction grating may be considered to form a two dimensional array of angularly spaced (but potentially spatially overlapping) pseudo-diffraction beams, the axes of this two-dimensional (square) array of pseudo-diffraction beams being parallel to the sides of the pseudo-unit cell. Since this square is not the unit cell (defined as to the smallest square of any orientation from which the repeating pattern of the diffraction grating is formed), the pseudo-pitch will be larger than the pitch (or fundamental pitch). Therefore, there will be a smaller separation between adjacent pseudo-diffraction beams in the diffraction pattern (in a direction parallel to the sides of the pseudo-unit cell) than there is between adjacent diffraction beams in the diffraction pattern (in a direction parallel to the sides of the unit cell). This can be understood as follows.

Some of the pseudo-diffraction beams correspond to diffraction beams in the diffraction pattern and the other pseudo-diffraction beams are unphysical and do not represent a diffraction beam generated by the diffraction grating (and only arise due to the use of a pseudo-unit cell that is larger than the true unit cell).

Taking any reduction (or enlargement) factor applied by the projection system PS into account, either the pitch of the second patterned region 32 in the shearing direction should be an integer multiple of the pitch of the first patterned region 31 in the shearing direction or the pitch of the first patterned region 31 in the shearing direction should be an integer multiple of the pitch of the second patterned region 32 in the shearing direction. In the example shown in FIGS. 5A-5C, the pitches of the first and second patterned regions 31, 32 in the shearing direction are substantially equal (taking into account any reduction factor).

As can be seen from FIGS. 5A-5C, each point on the detector region 39 of the radiation detector 23 will, in general, receive several contributions that are summed coherently. For example, the point on the detector region 39 which receives the second diffraction beam 35b that corresponds to the $-1^{st}$ order diffraction beam of second patterned region 32, which originates from the $0^{th}$ order diffraction beam 35 of first patterned region 31 overlaps with both: (a) the second diffraction beam 36a that corresponds to the $0^{th}$ order diffraction beam of second patterned region 32, which originates from the $-1^{st}$ order diffraction beam 36 of first patterned region 31; and (b) the second diffraction beam 34d that corresponds to the $-2^{nd}$ order diffraction beam of second patterned region 32, which originates from the $+1^{st}$ order diffraction beam 34 of first patterned region 31. It will be appreciated that when higher order diffraction beams of the first patterned region 31 are taken into account there will be more beams that should be summed coherently at each point on the detector region 39 in order to determine the intensity of radiation as measured by that part of the detector region 39 (for example a corresponding pixel in a two dimensional array of sensing elements).

In general, a plurality of different second diffraction beams contributes to the radiation received by each part of the detector region 39. The intensity of radiation from such a coherent sum is given by:

$$I = DC + \Sigma_{pairs(i)} \gamma_i \cos(\Delta\phi_i), \tag{2}$$

where DC is a constant term (which is equivalent to the incoherent sum of the different diffraction beams), the sum is over all pairs of different second diffraction beams, $\gamma_i$ is an interference strength for that pair of second diffraction beams and $\Delta\phi_1$ is a phase difference between that pair of second diffraction beams.

The phase difference $\Delta\phi_1$ between a pair of second diffraction beams is dependent on two contributions: (a) a first contribution relates to the different part of the pupil plane 37 of the projection system PS from which they originate; and (b) a second contribution relates to the position within the unit cells of each of the first and second patterned regions 31, 32 from which they originate.

The first of these contributions can be understood to arise from the fact that the different coherent radiation beams have passed through different parts of the projection system PS and are therefore related to the aberrations that it is desired to determine (in fact they are related to a difference between two points in the aberration map that are separated in the shearing direction).

The second of these contributions can be understood to arise from the fact that the relative phases of multiple rays of radiation that arise from a single ray incident on a diffraction grating will depend on which part of the unit cell of that grating the ray was incident. This therefore does not contain information relating to the aberrations. As explained above, in some examples, the measurement patterning device MA' and/or the sensor apparatus 21 are sequentially scanned and/or stepped in the shearing direction. This causes the phase differences between all of pairs of interfering radiation beams received by the radiation detector 23 to change. As the measurement patterning device MA' and/or the sensor apparatus 21 are sequentially stepped in the shearing direction by an amount that is equivalent to a fraction of the pitches (in the shearing direction) of the first and second patterned regions 31, 32, in general, the phase differences between pairs of second diffraction beams will all change. If the measurement patterning device MA' and/or the sensor apparatus 21 are stepped in the shearing direction by an amount that is equivalent to an integer multiple of the pitches (in the shearing direction) of the first and second patterned regions 31, 32 the phase differences between pairs of second diffraction beams will remain the same. Therefore, as the measurement patterning device MA' and/or the sensor apparatus 21 are by sequentially scanned and/or stepped in the shearing direction, the intensity received by each part of the radiation detector 23 will oscillate. The first harmonic of this oscillating signal (which may be referred to as a phase-stepping signal), as measured by the radiation detector 23, is dependent on the contributions to equation (1) that arise from adjacent first diffraction beams 34-36, i.e. first diffraction beams that differ in order by ±1. Contributions that arise from first diffraction beams that differ in order by a different amount will contribute to higher order harmonics of the signal determined by the radiation detector 23 due to such phase stepping techniques.

For example, of the three overlapping second diffraction beams discussed above (35b, 36a and 34d) only two of the three possible pairs of these diffraction beams will contribute to the first harmonic of the phase stepping signal: (a) second diffraction beams 35b and 36a (which originate from the $0^{th}$ order diffraction beam 35 and the $-1^{st}$ order diffraction beam 36 of first patterned region 31 respectively); and (b) second diffraction beams 35a and 34d (which originate from the $0^{th}$ order diffraction beam 35 and the $+1^{st}$ order diffraction beam 34 of first patterned region 31 respectively).

Each pair of second diffraction beams will result in an interference term of the form shown in equation (2), which contributes to the first harmonic of the phase stepping signal, i.e. an interference term of the form:

$$\gamma \cos\left(\frac{2\pi}{p} \cdot v + \Delta W\right) \qquad (3)$$

where $\gamma$ is an amplitude of the interference term, p is the pitch of the first and second patterned regions 31, 32 (in the shearing direction), v parameterizes the relative positions of the first and second patterned regions 31, 32 in the shearing direction and $\Delta W$ is a difference between the value of the aberration map at two positions in the pupil plane of the projection system PS, the two positions corresponding to the positions from which the two second diffraction beams originate. The amplitude $\gamma$ of the interference term is proportional to the product of the compound scattering efficiencies of the two second diffraction beams, as discussed further below. The frequency of the first harmonic of the phase stepping signal is given by the inverse of the pitch p of the first and second patterned regions 31, 32 in the shearing direction. The phase of the phase stepping signal is given by $\Delta W$ (the difference between the values of the aberration map at two positions in the pupil plane of the projection system PS, the two positions corresponding to the positions from which the two second diffraction beams originate).

The interference strength $\gamma_i$ for a pair of second diffraction beams is proportional to the product of the compound scattering efficiencies of the two second diffraction beams, as now discussed.

In general, the scattering efficiency of the diffraction beams produced by a diffraction grating will depend on the geometry of the grating. These diffraction efficiencies, which may be normalised to the efficiency of a $0^{th}$ order diffraction beam, describe the relative intensities of the diffraction beams. As used herein, the compound scattering efficiency of a second diffraction beam is given by the product of the scattering efficiency of the first diffraction beam from which it originates and the scattering efficiency for the diffraction order of the second patterned region 32 to which it corresponds.

In the above description of the examples shown in FIGS. 3A to 5C, where the first portion 15a' of the patterned region 15a shown in FIG. 3A is illuminated, the shearing direction corresponds to the v-direction and the non-shearing direction corresponds to the u-direction. It will be appreciated that when the second portion 15a" of the patterned region 15a shown in FIG. 3A is illuminated, the shearing direction corresponds to the u-direction and the non-shearing direction corresponds to the v-direction. Although in these above-described examples, the u and v-directions (which define the two shearing directions) are both aligned at approximately 45° relative to both the x and y-directions of the lithographic apparatus LA, it will be appreciated that in alternative examples the two shearing directions may be arranged at any angle to the x and y-directions of the lithographic apparatus LA (which may correspond to non-scanning and scanning directions of the lithographic apparatus LA). In general, the two shearing directions will be perpendicular to each other. In the following, the two shearing directions will be referred to as the u-direction and the v-direction. However, it will be appreciated that these shearing directions may be arranged at any angle relative to both the x and y-directions of the lithographic apparatus LA.

Figure 6A:
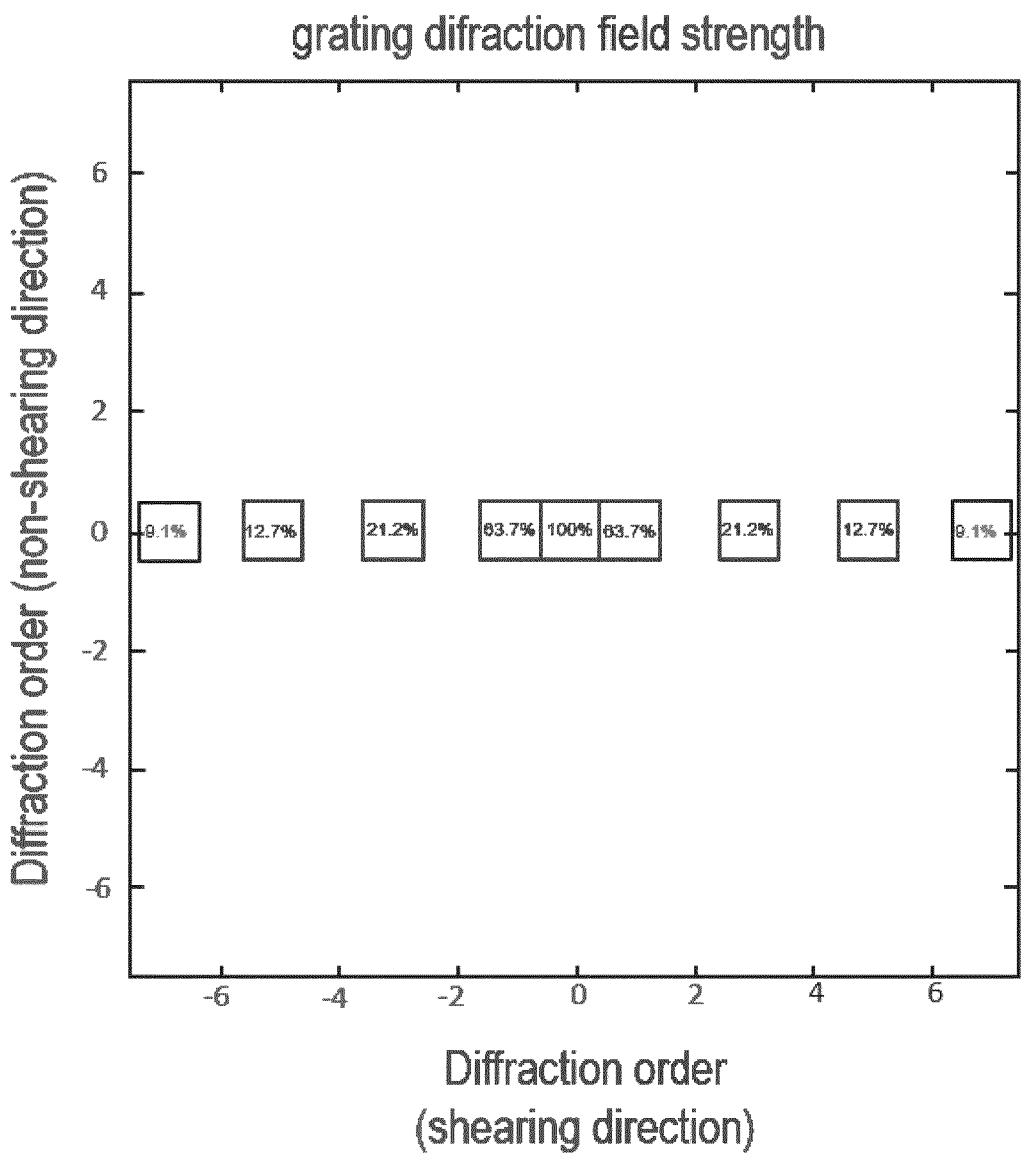
FIG. 6A shows the scattering efficiency for a one dimensional diffraction grating with a 50% duty cycle and which may represent the first patterned region of the measurement system shown in FIG. 4.

FIG. 6A shows the scattering efficiency for a first patterned region 31 that is of the form of the first portion 15a' of the patterned region 15a shown in FIG. 3A, having a 50% duty cycle. The horizontal axis represents the diffraction order in the shearing direction. The diffraction efficiencies shown in FIG. 6A are normalised to the efficiency of a $0^{th}$ order diffraction beam, such that the efficiency of the $0^{th}$ order diffraction beam is 100%. With this geometry (a 50% duty cycle), the efficiencies of the even diffraction orders (except the $0^{th}$ diffraction order) are zero. The efficiencies of the $\pm 1^{st}$ order diffraction beams are 63.7%.

Figure 6B:
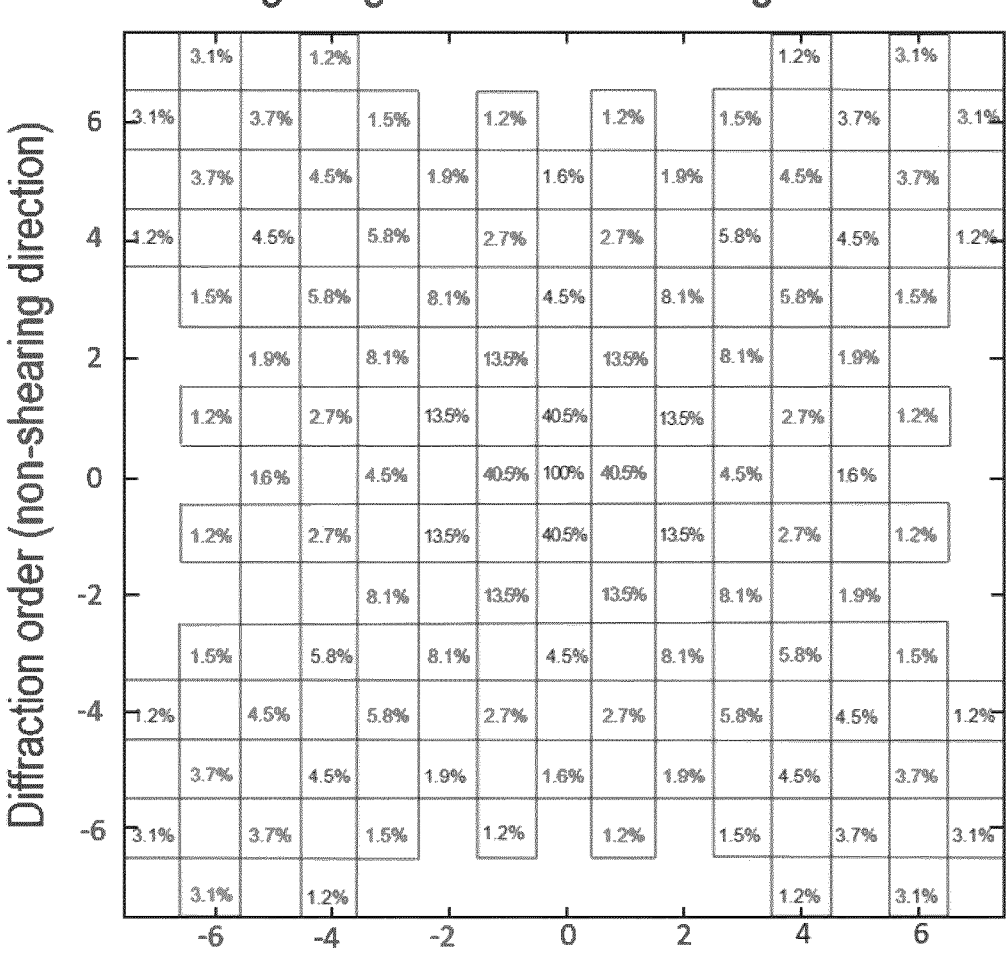
FIG. 6B shows the scattering efficiency for a two dimensional diffraction grating of the form of a checkerboard with a 50% duty cycle and which may represent the second patterned region of the measurement system shown in FIG. 4.

FIG. 6B shows the scattering efficiency for a second patterned region 32 that is of the form of the diffraction grating 19a shown in FIG. 3B, i.e. in the form of a checkerboard with a 50% duty cycle. The horizontal axis represents the diffraction order in the shearing direction. The vertical axis represents the diffraction order in the non-shearing direction. The diffraction efficiencies shown in FIG. 6B are normalised to the efficiency of the $(0, 0)^{th}$ order diffraction beam, such that the efficiency of the $(0, 0)^{th}$ order diffraction beam is 100%.

As explained above, the first harmonic of the oscillating phase-stepping signal only depends on the contributions to equation (1) from first diffraction beams that differ in order by ±1. As can be seen from FIG. 6A, with a 50% duty cycle grating on the measurement patterning device MA', the only two pairs of first diffraction beams that differ in order by ±1 are the $0^{th}$ order beam with either the $±1^{st}$ order beams. Furthermore, with this geometry for the first patterned region 31, the scattering efficiencies are symmetric such that the efficiencies of the $±1^{st}$ order diffraction beams are both the same (63.7%). Therefore, the interference strengths $γ_i$ for all pairs of second diffraction beams that contribute to the first harmonic of the oscillating phase-stepping signal can be determined as follows. A second copy of the scattering efficiency plot for the second patterned region 32 shown in FIG. 6B is weighted by the scattering efficiency for the $±1^{st}$ order diffraction beams of the first patterned region 31 and then overlaid with the scattering efficiency plot for the second patterned region 32 shown in FIG. 6B but shifted in the shearing direction by the separation of 1 pair of diffraction orders (of the first patterned region 31). Here, the pitches of the first and second patterned regions 31, 32 in the shearing direction are equal (taking into account any reduction factor applied by the projection system PS) and therefore, in this example, the second copy of the scattering efficiency plot for the second patterned region 32 is a shifted in the shearing direction by 1 diffraction order of the second patterned region 31. The product of the scattering efficiencies of these two overlaid scattering efficiencies plots is then determined. Such a plot of the interference strengths $γ_i$ for all pairs of second diffraction beams that contribute to the first harmonic of the oscillating phase-stepping signal is shown in FIG. 6C.

Figure 6C:
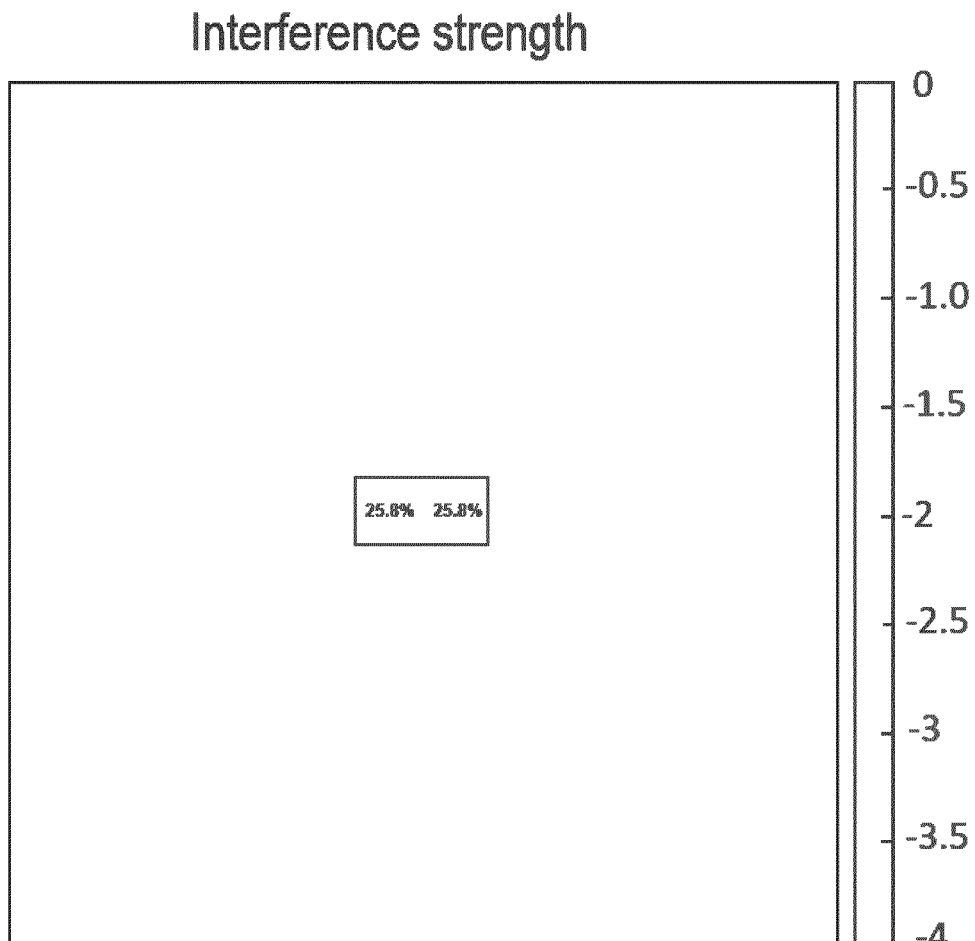
FIG. 6C shows an interference strength map for the measurement system shown in FIG. 4 when employing the first patterned region shown in FIG. 6A and the second patterned region shown in FIG. 6B, each of the interference strengths shown representing the second interference beams which contribute to the first harmonic of the oscillating phase-stepping signal and which have a different overlap, at the radiation detector, with a circle that represents the numerical aperture of the projection system PS.

Note that each of the interference strengths $γ_i$ shown in FIG. 6C actually represents two different pairs of second diffraction beams. For example, the left hand pixel shown in FIG. 6C represents both: (a) interference between second diffraction beams 35a and 34b and (b) second diffraction beam 35b and 36a. Similarly, the right hand pixel shown in FIG. 6C represents both: (a) interference between second diffraction beam 35a and 36c and (b) second diffraction beam 35c and 34a. In general, each pixel of such a map represents two pairs of second diffraction beams: (a) a first pair of second diffraction beams that include one second diffraction beam that originated from the first diffraction beam 35 corresponding to the $0^{th}$ diffraction order of first patterning device 31 and another second diffraction beam that originated from the first diffraction beam 34 corresponding to the +1' order diffraction order of first patterned region 31; and (b) a second pair of second diffraction beams that include one second diffraction beam that originated from the first diffraction beam 35 corresponding to the $0^{th}$ diffraction order of first patterning device 31 and another second diffraction beam that originated from the first diffraction beam 36 corresponding to the $−1^{st}$ order diffraction order of first patterned region 31.

In general, each of the interference strengths $γ_i$ shown in FIG. 6C represents two different pairs of second diffraction beams: (a) one pair comprising an nth order second diffraction beam produced by the first diffraction beam 35 (that corresponds to the $0^{th}$ order diffraction beam of first patterned region 31); and (b) another pair comprising an $(n+1)^{th}$ order second diffraction beam produced by the first diffraction beam 35. Therefore, each interference strength $γ_i$ may be characterized by the two diffraction orders of the first diffraction beam 35 ($(n,m)^{th}$ and $(n+1, m)^{th}$) that contribute, and may be denoted as $γ_{n,n+1;m}$. In the following, where it is clear that m=0, or the value of m is unimportant, this interference strength may be denoted as $γ_{n,n+1}$.

Although each of the interference strengths $γ_i$ (or $γ_{n,n+1;m}$) shown in FIG. 6C represents two different pairs of second diffraction beams, each of the interference strengths $γ_i$ shown in FIG. 6C represents the second diffraction beams which contribute to the first harmonic of the oscillating phase-stepping signal and which have a different overlap, at the radiation detector 23, with a circle that represents the numerical aperture of the projection system PS, as now described.

Figures 7A, 7B, 7C, 8A, 8B, 8C, 9A, 9B, 9C, 10A, 10B, 10C:
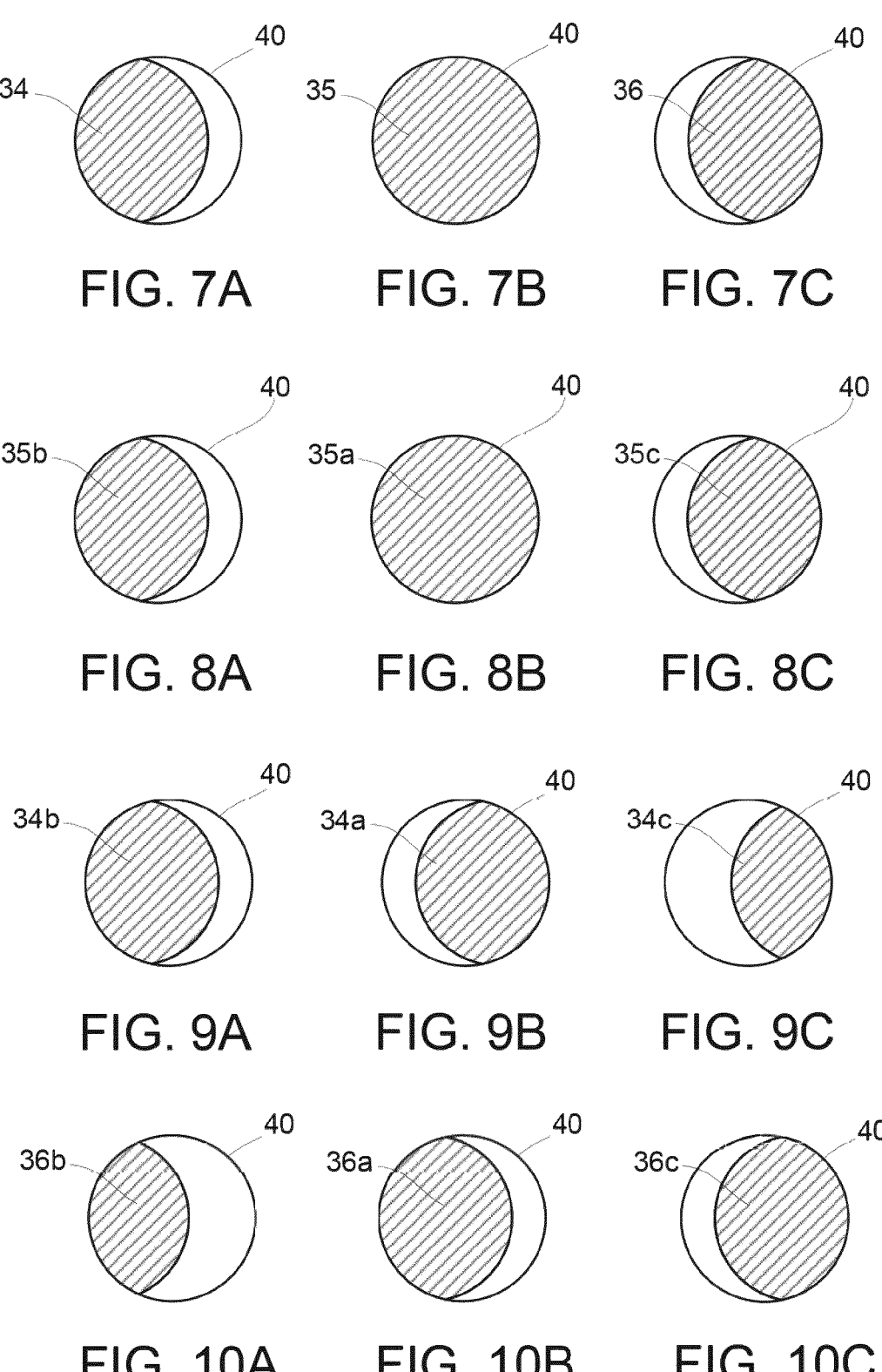
FIGS. 7A, 7B and 7C show the portion of the numerical aperture of the projection system of the measurement system shown in FIG. 4 that is filled by the three different first diffraction beams shown in FIG. 4.
FIGS. 8A-8C show a portion of the radiation detector of the measurement system shown in FIG. 4 which corresponds to the numerical aperture of the projection system of the measurement system and which is filled by three second diffraction beams which originate from the first diffraction beam represented by FIG. 7B.
FIGS. 9A-9C show a portion of the radiation detector of the measurement system shown in FIG. 4 which corresponds to the numerical aperture of the projection system of the measurement system and which is filled by three second diffraction beams which originate from the first diffraction beam represented by FIG. 7A.
FIGS. 10A-10C show a portion of the radiation detector of the measurement system shown in FIG. 4 which corresponds to the numerical aperture of the projection system of the measurement system and which is filled by three second diffraction beams which originate from the first diffraction beam represented by FIG. 7C.

FIGS. 7A, 7B and 7C show the portion of the pupil plane 37 of the projection system PS which corresponds to the numerical aperture of the projection system PS that is filled by first diffraction beams 34, 35, 36 respectively. In each of FIGS. 7A, 7B and 7C the numerical aperture of the projection system PS is represented by a circle 40 and the portion of the pupil plane 37 of the projection system PS that is filled by first diffraction beams 34, 35, 36 is shown by a shaded region of this circle 40 in FIGS. 7A, 7B and 7C respectively. As can be seen from FIG. 7B, in the example shown, the central first diffraction beam 35 which corresponds to a $0^{th}$ order diffraction beam substantially fills the numerical aperture of the projection system PS. As can be seen from FIGS. 7A and 7C, each of the two first diffraction beams 34, 36 which correspond to the $±1^{st}$ order diffraction beams of first patterned region 31 have been shifted such that they only partially fill the numerical aperture. It will be appreciated that this shift of the first order first diffraction beams 34, 36 relative to the numerical aperture is in practice very small and has been exaggerated here for ease of understanding.

FIGS. 8A-10C show the portion of the radiation detector 23 that is filled by various second diffraction beams. In each of FIGS. 8A-10C the numerical aperture of the projection system PS is represented by a circle 40 and the portion of this circle that is filled by the second diffraction beams is shown by a shaded region of this circle 40. FIGS. 8A-8C show the portion of the circle 40 that is filled by $(−1, 0)^{th}$ $(0, 0)^{th}$ and $(1, 0)^{th}$ order diffraction beams 35b, 35a, 35c which originate from the first diffraction beam 35 which corresponds to a $0^{th}$ order diffraction beam of the first patterned region 31. FIGS. 9A-9C show the portion of the circle 40 that is filled by $(−1, 0)^{th}$ $(0, 0)^{th}$ and $(1, 0)^{th}$ order diffraction beams 34b, 34a, 34c which originate from the first diffraction beam 34 which corresponds to the $1^{st}$ order diffraction beam of the first patterned region 31. FIGS. 10A-10C show the portion of the circle 40 that is filled by $(−1, 0)^{th}$ $(0, 0)^{th}$ and $(1, 0)^{th}$ order diffraction beams 36b, 36a, 36c which originate from the first diffraction beam 36 which corresponds to the $−1^{st}$ order diffraction beam of the first patterned region 31.

It can be seen from FIGS. 8B, 9A, 8A and 10B that the region of the radiation detector which receives a contribution from both: (a) interference between second diffraction beams 35a and 34b and (b) second diffraction beam 35b and 36a is the region 41 shown in FIG. 11A. Similarly, it can be seen from FIGS. 8B, 10C, 8C and 9B that the region of the radiation detector which receives a contribution from both: (a) interference between second diffraction beam 35a and 36c and (b) second diffraction beam 35c and 34a is the region 42 shown in FIG. 11B.

In general, each of the interference strengths $γ_i$ shown in FIG. 6C may be considered to represent a beam of radiation formed by a plurality of interfering second interference beams, each such beam of radiation formed by a plurality of interfering second interference beams propagating in a different direction, such that the overlap of each such beam of radiation at the radiation detector 23, with a circle that represents the numerical aperture of the projection system PS is different.

In general, the second diffraction beams can be considered to form a plurality of beams of radiation, each such beam of radiation being formed by a set of interfering second diffraction beams. Each such beam of radiation may be referred to herein as an interference beam. Each such interference beam formed by a plurality of interfering second interference beams may be considered to propagate in a different direction, such that the overlap of each interference beam at the radiation detector 23 with a circle that represents the numerical aperture of the projection system PS is different. Although they may be considered to propagate in different directions and have a different overlap with a circle that represents the numerical aperture of the projection system PS, there is significant overlap between the different interference beams at the radiation detector 23. Each of the interference strengths $\gamma_i$ shown in FIG. 6C may be considered to represent a different interference beam (formed by a plurality of interfering second interference beams).

As previously described, each of the interference strengths $\gamma_i$ (or $\gamma_{n,n+1;m}$) shown in FIG. 6C represents two different pairs of second diffraction beams. However, for a given position on the radiation detector, both of these pairs of contributing second diffraction beams comprise two interfering rays that originate from the same two points in the pupil plane 37 of the projection system PS. In particular, for a position (x,y) on the radiation detector (these co-ordinates corresponding to co-ordinates of the pupil plane 37 of the projection system PS and the x direction corresponding to the shearing direction), the two pairs of interfering second diffraction beams that contribute and have an interference strengths $\gamma_{n,n+1;m}$ each comprise a ray of a second diffraction beam that originated from a position (x-ns, y-ms) in the pupil plane 37 and a ray of a second diffraction beam that originated from a position (x-(n+1)s, y-ms) in the pupil plane 37, where s is a shearing distance. The shearing distance s corresponds to the distance in the pupil plane 37 between two coherent rays of adjacent first diffraction beams 34-36. Therefore, both pairs of contributing second diffraction beams give rise to an interference term of the form of expression (3), where $\Delta W$ is a difference between the value of the aberration map at these two positions in the pupil plane 37.

It can be seen from FIG. 6C that with a second patterned region 32 which is of the form of a 50% duty cycle checkerboard there are only two sets of second diffraction beams that contribute to the first harmonic of the phase stepping signal, both with an interference strength ($\gamma_{-1,0}$, $\gamma_{0,+1}$) of 25.8%. This is due to the checkerboard geometry, which, as can be seen in from FIG. 6A, results in a diffraction efficiency plot where, with the exception of the $(-1, 0)^{th}$ $(0, 0)^{th}$ and $(1, 0)^{th}$ order diffraction beams, moving in the shearing direction, every other diffraction beam has a diffraction efficiency of 0%. That is, the grating efficiencies of the $(n,m)^{th}$ diffraction orders wherein $n\pm m$ is an even number are all zero, except the $(0, 0)^{th}$ diffraction order. As a result of these grating efficiencies being zero, all of the interference strengths which contribute to the first harmonic of the phase stepping signal are zero except for interference strengths $\gamma_{-1,0}$ and $\gamma_{0,+1}$.

For the overlap between the two regions 41, 42 shown in FIGS. 11A and 11B (this overlap region will form the majority of circle 40 for small shearing angles) the first harmonic of the oscillating phase-stepping signal will be proportional to the sum of two cosines (cf. equation (2) and expression (3)):

$$I=DC+\gamma_{-1,0}\cos(W_{-1}-W_0)+\gamma_{0,+1}\cos(W_0-W_{+1}) \qquad (4)$$

where the first cosine is of a difference in the aberration map between a first two points in the pupil plane and the second cosine is of a difference in the aberration map between a second two points in the pupil plane (here the phase stepping terms have been omitted for clarity of understanding). In particular, for a given position (x,y) on the radiation detector (x referring to the shearing direction), the first two points include a corresponding point in the pupil plane (x,y) (represented as $W_0$ in equation (4)) and another point which is shifted in a first direction along the shearing direction by the shearing distance (x-s, y) (represented as $W_{-1}$ in equation (4)). Similarly, the second two points include a corresponding point in the pupil plane (x,y) (represented as $W_0$ in equation (4)) and another point which is shifted in a second direction along the shearing direction by the shearing distance (x+s, y) (represented as $W_{+1}$ in equation (4)).

Existing wavefront reconstruction techniques exploit the fact that the two interference strengths in equation (4) are equal such that this sum of two cosines can be re-written using trigonometric identities as a cosine of the difference in the aberration map between two positions that are separated in the shearing direction by twice the shearing distance, i.e. $\cos(W_{-1}-W_{+1})$, multiplied by a factor that is approximately 1 for small shearing distances. Therefore, such known techniques involve the determination of a set of Zernike coefficients by equating the phase of the first harmonic of a phase stepping signal to a difference in the aberration map between positions in the pupil plane that are separated in the shearing direction by twice the shearing distance. Recall that the aberration map depends on the Zernike coefficients (see equation (1)). This is done for a plurality of positions on the radiation sensor (for example at a plurality of pixels or individual sensing elements in an array) first for a first shearing direction and then subsequently for a second, orthogonal direction. These constraints for the two shearing orthogonal directions are simultaneously solved to find the set of Zernike coefficients.

As discussed above, the combination of a first patterned region 31 comprising a linear grating and a second patterned region 32 comprising a two-dimensional checkerboard is advantageous (since only two interference beams contribute to the first harmonic of the phase stepping signal). Due to the geometry of the checkerboard, checkerboard gratings typically comprise an optical transmissive carrier or support layer.

Figure 12:
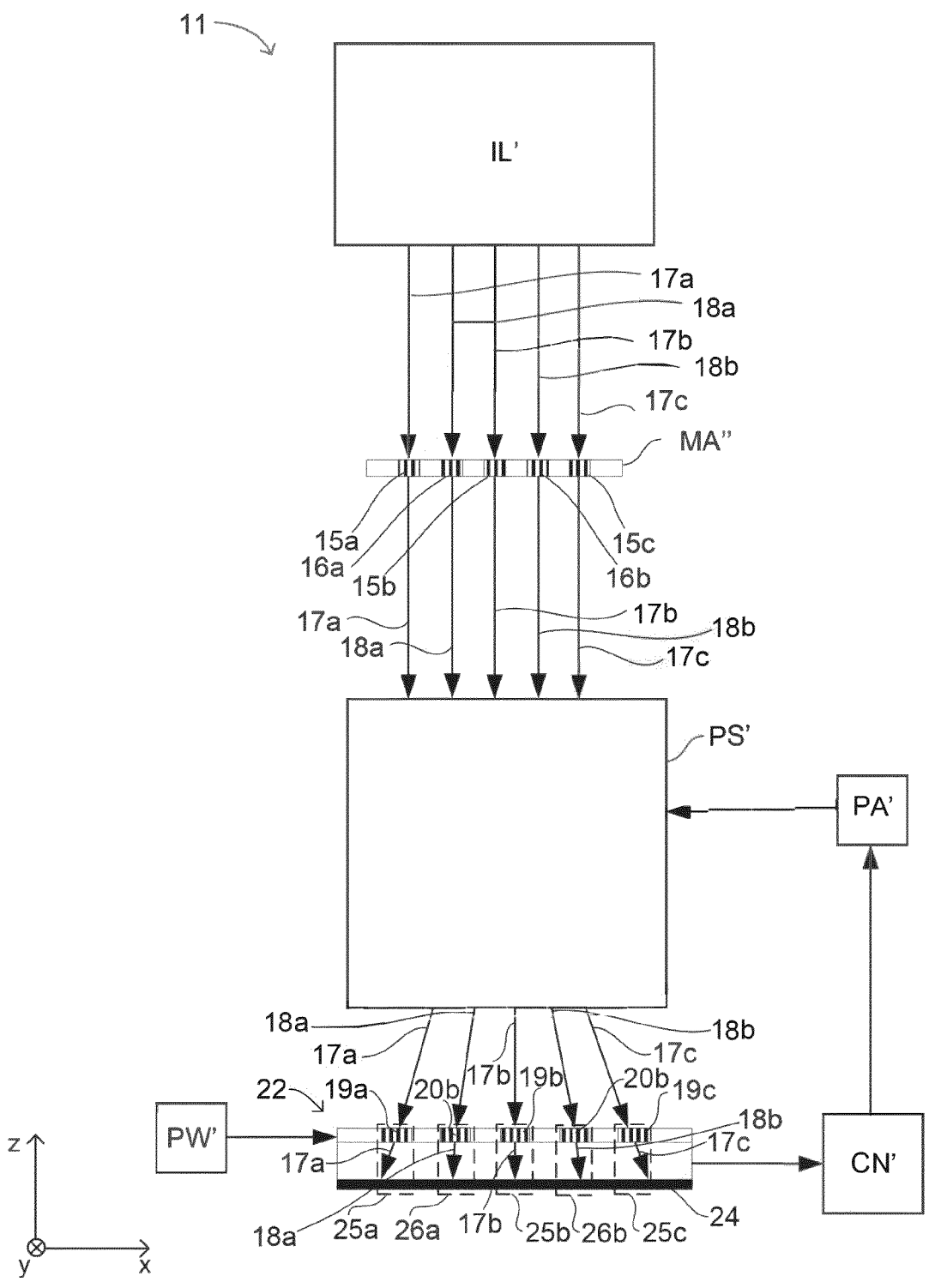
FIG. 12 is a schematic illustration of a measurement system according to an embodiment of the invention.

FIG. 12 is a schematic illustration of a measurement system 11 which may be used to determine aberrations which are caused by a projection system PS'. The measurement system 11 comprises an illumination system IL', a measurement patterning device MA", a sensor apparatus 22 and a controller CN'. The measurement system 11 may form part of a lithographic apparatus. For example, the illumination system IL' and the projection system PS' which are shown in FIG. 12 may be the illumination system IL and projection system PS of the lithographic apparatus which is shown in FIG. 1. For ease of illustration additional components of a lithographic apparatus are not shown in FIG. 12. The measurement system 11 is similar to the measurement system 10 of FIG. 2 except that the measurement patterning device MA" comprises additional first patterned regions 16a and the sensor apparatus 22 comprises additional second patterned regions 20a-20b.

Figure 13A:
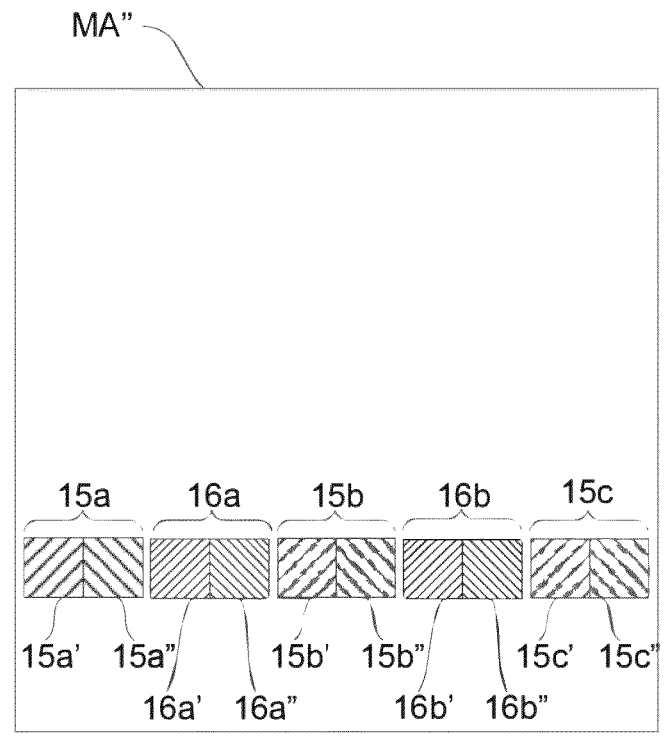
FIGS. 13A and 13B are schematic illustrations of a patterning device and a sensor apparatus which may form part of the measurement system of FIG. 12.
Figure 13B:
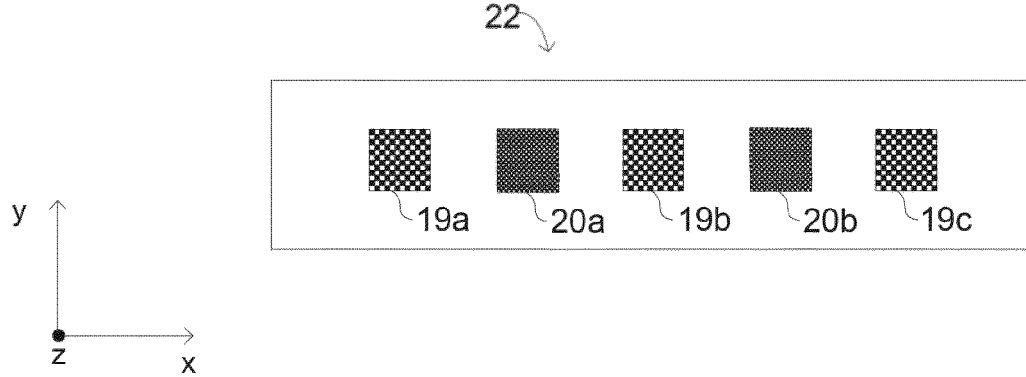

FIG. 13A is a schematic illustration of the measurement patterning device MA" in an x-y plane and FIG. 13B is a schematic illustration of the sensor apparatus 22 in an x-y plane.

The measurement patterning device MA" is similar to the measurement patterning device MA' of FIG. 3A except that the measurement patterning device MA" comprises the additional first patterned regions 16a-16b. The sensor apparatus 22 is similar to the sensor apparatus 21 of FIG. 3B except that sensor apparatus 22 comprises the additional second patterned regions 20a-20b. The measurement patterning device MA" and the sensor apparatus 22 function in a similar way to the measurement patterning device MA" and the sensor apparatus 21 of FIGS. 3A and 3B and, to avoid repetition, only the differences will be explained here.

The measurement patterning device MA" still comprises a plurality of patterned regions 15a-15c. In the embodiment which is shown in FIGS. 12 and 13A the measurement patterning device MA" is a transmissive patterning device MA". The patterned regions 15a-15c and the additional patterned regions 16a-16b each comprise a transmissive diffraction grating.

The illumination system IL' illuminates the measurement patterning device MA" with radiation. In the embodiment which is shown in FIG. 12, the illumination system IL' is configured to form separate measurement beams 17a-17c and additional separate measurement beams 18a-18b. Each measurement beam 17a-17c illuminates a respective patterned region 15a-15c of the measurement patterning device MA" and each measurement beam 18a-18b illuminates a respective additional patterned region 16a-16b of the measurement patterning device MA".

The patterned regions 15a-15c modify the measurement beams 17a-17c and the additional patterned regions 16a-16b modify the additional measurement beams 18a-18b. In particular, the additional patterned regions 16a-16b cause a spatial modulation of the additional measurement beams 18a-18b and cause diffraction in the additional measurement beams 18a-18b. In the embodiment which is shown in FIG. 13A the additional patterned regions 16a-16b each comprise two distinct portions. For example, a first additional patterned region 16a comprises a first portion 16a' and a second portion 16a". The first portion 16a' comprises a diffraction grating which is aligned parallel to a u-direction and the second portion 16a" comprises a diffraction grating which is aligned parallel to a v-direction. The u and v-directions are depicted in FIG. 13A. The u and v-directions are both aligned at approximately 45° relative to both the x and y-directions and are aligned perpendicular to each other. The second additional patterned region 16b which is shown in FIG. 13A is identical to the first additional patterned region 16a and comprises first and second portions whose diffraction gratings are aligned perpendicular to each other.

The modified additional measurement beams 18a-18b are received by the projection system PS'. The projection system PS' forms an image of the additional patterned regions 16a-16b on the sensor apparatus 22. The sensor apparatus 22 comprises a plurality of additional diffraction gratings 20a-20b (i.e. second patterned regions) and a radiation detector 24. The additional diffraction gratings 20a-20b are arranged such that each additional diffraction grating 20a-20b receives a respective additional modified measurement beam 18a-18b which is output from the projection system PS'. The modified additional measurement beams 18a-18b which are incident on the additional diffraction gratings 20a-20b are further modified by the additional diffraction gratings 20a-20b. The modified measurement beams 18a-

18b which are transmitted at the additional diffraction gratings 20a-20b are incident on the radiation detector 24.

The projection system PS' is configured to project the modified measurement beam 18a from the additional patterned region 16a and the additional diffraction grating 20a is arranged to receive the modified measurement beam 18a (more generally first diffraction beams) from the projection system PS'. The additional diffraction grating 20a further modifies the modified measurement beam 18a (i.e. more generally, into a plurality of second diffraction beams from each of the first diffraction beams) such that the additional patterned region 16a and the additional diffraction grating 20a form a set. It will be appreciated that there is a plurality of sets, i.e. in this embodiment, there are five sets corresponding to each of the pairs of patterned regions 15a-15c, 16a-16b (i.e. first patterned regions) and diffraction gratings 19a-19c, 20a-20b (second patterned regions). More generally, each set comprises one of the plurality of first patterned regions 15a-15c, 16a-16b and one of the plurality of second patterned regions 19a-19c, 20a-20b. In embodiments the pitch of the first patterned region and the pitch of the second patterned region in the same set may be the same or may be an integer multiple. However, in other embodiments, the pitch of the first patterned region and the pitch of the second patterned region in the same set may be different. Generally, the first and second patterned regions in the set may be matched by matching the pitches of the first and second patterned regions in the shearing direction such that at least some of the second diffraction beams formed from at least one of the first diffraction beams are spatially coherent with a second diffraction beam formed from at least one other first diffraction beam to form interference patterns on the radiation detector.

The patterned region 15a and the additional patterned region 16a may be considered to be adjacent gratings. The diffraction grating 19a and the additional diffraction grating 20a may be considered to be adjacent gratings. Likewise, the additional patterned region 16a and the patterned region 15b may be considered to be adjacent gratings. The additional diffraction grating 20a and the diffraction grating 19b may be considered to be adjacent gratings.

It will be appreciated that adjacent gratings form adjacent sets. The set including the patterned region 15a and the diffraction grating 19a and the set including the additional patterned region 16a and the additional diffraction grating 20a may be considered to be adjacent sets. Likewise, the set including the additional patterned region 16a and the additional diffraction grating 20a and the set including the patterned region 15b and the diffraction grating 19b may be considered to be adjacent sets.

The diffraction additional gratings 20a-20b and portions of the radiation sensor 24 at which the modified additional measurement beams 18a-18b are received form detector regions 26a-26b. A measurement of a given additional measurement beam 18a-18b may be made at a respective detector region 26a-26b (as depicted).

The modification of the measurement beams 17a-17c which occurs at the patterned regions 15a-15c and the diffraction gratings 19a-19c of the detector regions 25a-25c results in interference patterns being formed on the radiation detector 24. The modification of the additional measurement beams 18a-18b which occurs at the additional patterned regions 16a-16b and the additional diffraction gratings 20a-20b of the additional detector regions 26a-26b also result in interference patterns being formed on the radiation detector 24. The interference patterns are related to the derivative of the phase of the measurement beams and depend on aberrations caused by the projection system PS'. The interference patterns may therefore be used to determine aberrations which are caused by the projection system PS'.

In general, the additional diffraction gratings $20a$-$20b$ of each of the detector regions $26a$-$26b$ comprises a two-dimensional transmissive diffraction grating. In the embodiment which is shown in FIG. 13B the additional detector regions $26a$-$26b$ each comprise an additional diffraction grating $20a$-$20b$ which is configured in the form of a checkerboard.

The controller CN' receives measurements made at the sensor apparatus 22 and determines, from the measurements, aberrations which are caused by the projection system PS'. The controller CN' may be configured to control one or more components of the measurement system 11. For example, the controller CN' may control a positioning apparatus PW' which is operable to move the sensor apparatus 22 and/or the measurement patterning device MA" relative to each other. The controller CN' may control an adjusting means PA' for adjusting components of the projection system PS'. For example, the adjusting means PA' may adjust optical elements of the projection system PS' so as to correct for aberrations which are caused by the projection system PS' and which are determined by the controller CN'.

Determining aberrations (which may be caused by the projection system PS or by placement errors of the patterning device MA or the substrate W) may comprise fitting the measurements which are made by the sensor apparatus 22 to Zernike polynomials in order to obtain Zernike coefficients. Different Zernike coefficients may provide information about different forms of aberration which are caused by the projection system PS'. Zernike coefficients may be determined independently at different positions in the x and/or the y-directions. For example, in the embodiment which is shown in FIGS. 12, 13A and 13B, Zernike coefficients may be determined for each measurement beam $17a$-$17c$ and for each additional measurement beam $18a$-$18b$.

In this embodiment, the measurement patterning device MA" comprises five patterned regions $15a$-$15c$, $16a$-$16b$, and the sensor apparatus 22 comprises five detector regions $25a$-$25c$, $26a$-$26b$ and five measurement beams $17a$-$17c$, $18a$-$18b$ are formed. This allows the Zernike coefficients to be determined at more positions (i.e. more field points) than in the example of FIGS. 2, 3A and 3B. In some embodiments the measurement patterning device MA" may comprise more than five patterned regions, the sensor apparatus 22 may comprise more than five detector regions and more than five measurement beams may be formed. In some embodiments the patterned regions and the detector regions may be distributed at different positions in both the x and y-directions. This may allow the Zernike coefficients to be determined at positions which are separated in both the x and the y-directions.

If more field points are measured, then there is more potential for correction of the aberrations. For example, by inserting an additional lens to manipulate the wavefront. This may result in more degrees of freedom and thus a more densely sampled grid of measurements may be required. Currently, with e.g. seven field points being measured by the measurement system, separate measurements need to be taken and the results combined together. However, being able to measure thirteen field points at the same time, for example, then a single measurement may be sufficient to realize the desired correction potential without needing to combine a plurality of measurements. Using the increased sampling of an increased number of field points, e.g. thirteen field points, leads to a better measurement system reproducibility, i.e. repeatability of a measurement, for reticle alignment. Previously, with seven field points being measured, the previous measurements may be considered to have been taken at only odd field point locations in a thirteen field point line, i.e. at positions 1, 3, 5, 7, 9, 11, and 13.

The additional patterned regions $16a$-$16b$ between the patterned regions $15a$-$15c$ and the additional diffraction gratings $20a$-$20b$ between the diffraction gratings $19a$-$19c$ means that with the same size of measurement system (i.e. same width of patterning devices and sensor apparatus) more field points may be measured. It may be considered that the additional diffraction gratings are included at even field point locations, e.g. at positions 2, 4, 6, 8, 10 and 12 in a thirteen field point line. However, due to the diffraction gratings being closer together, pixels on the radiation detector 24 may receive signals from more than one diffraction grating (i.e. more than one measurement beam.) Thus, in the embodiment of FIGS. 13A and 13B, the interference patterns formed on the radiation detector 24 may overlap to a certain extent. This is not specifically shown in FIG. 12 for clarity reasons.

In order to distinguish the signals from the pixels which have overlapping radiation incident thereon from more than one measurement beam from adjacent diffraction gratings, the adjacent diffraction gratings have different pitches. This introduces encoding for the information from adjacent diffraction gratings.

In the embodiment of FIGS. 13A and 13B the pitches of the additional patterned regions $16a$-$16b$ are shown being two times that of patterned regions $15a$-$15c$. That is, the additional patterned regions $16a$-$16b$ are shown having approximately two times the number of grating lines as that of the patterned regions $15a$-$15c$. In addition, the pitches of the additional diffraction gratings $20a$-$20b$ are shown being two times that of the diffraction gratings $19a$-$19c$. That is, the additional diffraction gratings $20a$-$20b$ are shown having approximately two times the number of checkerboard boxes as that of the diffraction gratings $19a$-$19c$. However, this is just an example, and in other embodiments, the pitches of the additional patterned regions $16a$-$16b$ may be different multiples of the patterned regions $15a$-$15c$ and the pitches of the additional diffraction gratings $20a$-$20b$ may be different multiples of the diffraction gratings $19a$-$19c$, e.g. 3 times larger.

For example, the pitches of the of the additional patterned regions $16a$-$16b$ may be non-integer multiples of the patterned regions $15a$-$15c$ and the pitches of the additional diffraction gratings $20a$-$20b$ may be non-integer multiples of the diffraction gratings $19a$-$19c$. Software (e.g. algorithms) may be programmed to disentangle the signals from adjacent gratings without requiring them to have pitches of integer multiples. Furthermore, having non-integer multiples may provide more freedom to choose the particular difference in pitch, i.e. there may be more choice to obtain the desired performance. It may be preferable that the pitches of adjacent diffraction gratings (e.g. additional diffraction grating $20a$ and diffraction grating $19a$) are not even number integer multiples as, since the gratings may have a 50% duty cycle (i.e. checkerboard design), then even diffraction orders, e.g. factor 2, 4, 6 etc. may be difficult, or not possible, to distinguish between adjacent gratings.

In embodiments, the first and second patterned regions only extend in the x-direction (i.e. a single direction) so they are 1D but, in other embodiments, the first and second patterned regions may extend in both the x-direction and the y-direction (i.e. two orthogonal directions) so they are 2D.

In the 2D case, adjacent patterned regions may have different pitches in both directions.

In embodiments, the pitches of the first patterned regions (patterned regions 15a-15c and additional patterned regions 16a-16b) may be different in adjacent sets and the pitches of the second patterned regions (diffraction gratings 19a-19c and additional diffraction gratings 20a-20b) may be different in adjacent sets. However, in other embodiments, the pitches of either the first patterned regions or the second patterned regions in adjacent sets may be different in adjacent sets, i.e. either the first or the second patterned regions may have pitches that are the same for adjacent gratings. It may be preferable for the pitches of the second patterned regions in adjacent sets to be different rather than the pitches of the first patterned regions in adjacent sets to be different.

In embodiments, the pitches of alternating patterned regions may be the same. That is, the pitch of every other diffraction grating may be the same. For example, the pitches of each of the additional diffraction gratings 20a-20b may be the same and the pitches of each of the diffraction gratings 19a-19c may be the same (with the pitch of the adjacent diffraction gratings still being different). This may simply require calculations to disentangle the signals. However, in embodiments, the pitches of the alternating patterned regions may be different as well as the adjacent patterned regions being different.

Figures 14, 15:
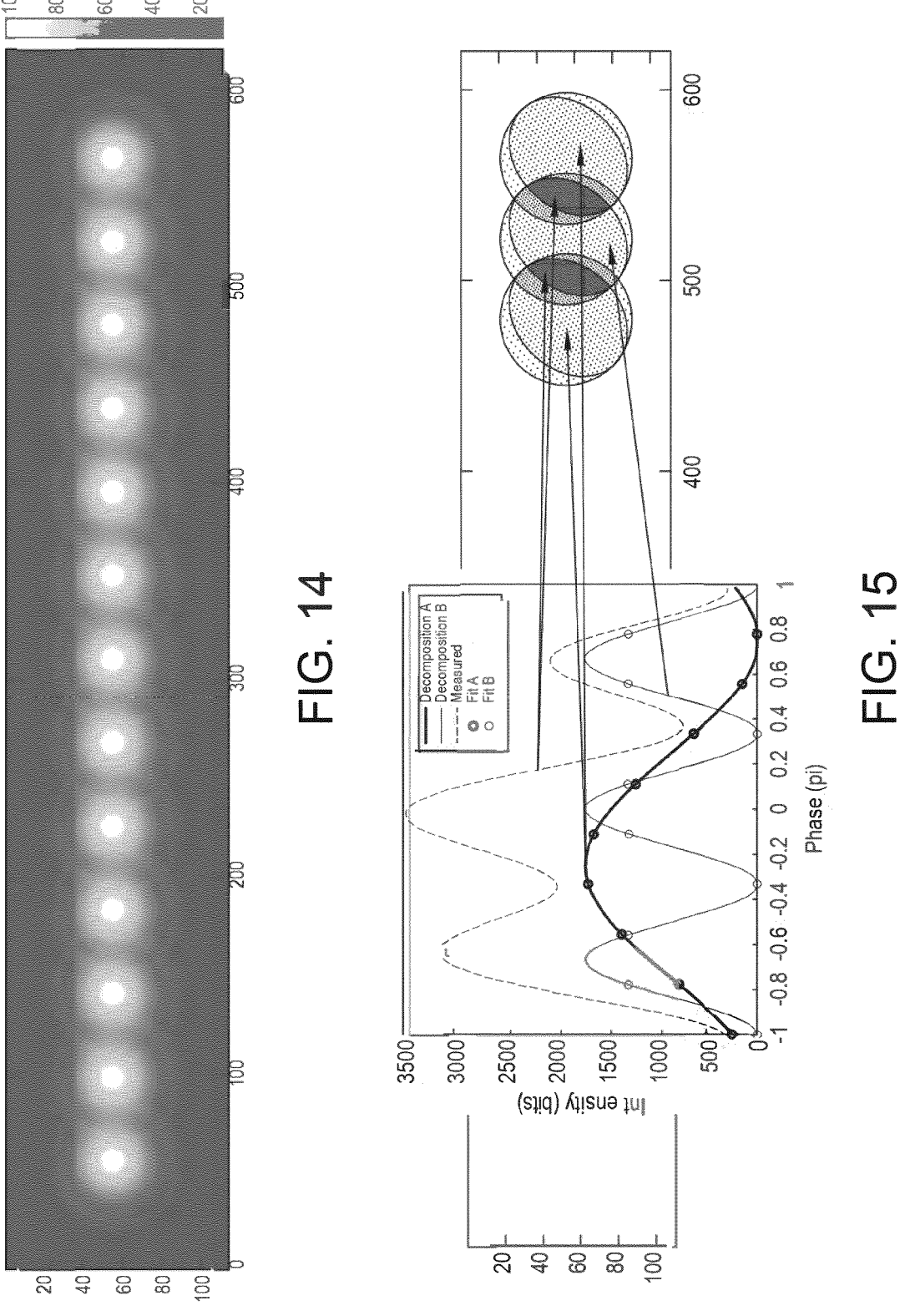
FIG. 14 shows a spatial intensity plot of measurements taken by a measurement system according to an embodiment of the invention.
FIG. 15 shows a graph of phase curves of measurements taken by a measurement system according to an embodiment of the invention.

FIG. 14 shows a spatial intensity plot of measurements taken by the measurement system 11 with an example thirteen field points being measured. The x and y axes show the spatial position in bits with the intensity bar on the right measuring up to 1000. It may be seen that the intensity is highest in the centre of the field points but that there is some overlap between field points. The field points have enough separation to allow thirteen field points onto the sensor apparatus 22 without saturating the radiation detector 24 (e.g. a camera). The thirteen field points may require thirteen sets of first and second patterned regions.

FIG. 15 shows the different phase curves measured on different positions on the camera. More particularly, FIG. 15 shows a front graph of phase (pi) for the camera and a rear graph indicating the spatial position for the camera for the field points. For the back graph, the x and y axes again show the spatial position in bits.

In this embodiment, the pitches of the additional patterned regions 16a-16b are three times less than that of patterned regions 15a-15c and the pitches of the additional diffraction gratings 20a-20b are three times less than that of the diffraction gratings 19a-19c. That is, the pitches of the gratings in the even field point locations are three times less than the pitches in the odd field point locations. For clarity, FIG. 15 only shows three of the thirteen field points, but it will be appreciated that the remaining ten could be shown similarly. The even and odd field points may more generally be considered to be adjacent field points.

As can be seen from the position and intensity graph in FIG. 15, there are overlapping regions between the detected radiation for adjacent field points. Each field point may have a plurality of diffraction beams which interfere (i.e. diffraction beams with different orders). Some of these diffraction beams may overlap as shown.

In the phase and intensity graph of FIG. 15, the fit of the measurements taken by the measurement system 11 is shown (i.e. the measured line) indicating intensity peaks for the field points locations. The phase and corresponding intensity can be fitted to distinguish between the signals from the odd field points and the signals from the even field points. Lines may be fitted to fit A points and fit B points to provide a decomposition A line and a decomposition B line respectively. As can be seen from the graph, decomposition A has a period which is three times the period of decomposition B (i.e. three full sine waves are shown for decomposition B for the one sine wave of decomposition A) and thus, decomposition A maps onto the even field points, which, in this case, have gratings with pitches which are three times less than that of the gratings at the odd field points.

More particularly, since the period is known (from the pitches of the gratings) the phase may be determined at each pixel location and a phase map for each of the pixels may be provided. In this case a total of nine phase steps are used to illustrate the situation. However, it will be appreciated that, in other embodiments, a different number of phase steps may be used. To fit the sine wave for the gratings with a different pitch, then a minimum of 4 phase steps would be required. This is because there are four unknowns, two phases and two amplitudes.

The phase map may then be linearly fitted to the Zernike coefficients to provide the aberration map. The aberration map provides the aberrations for the projection system PS'.

Figure 16:
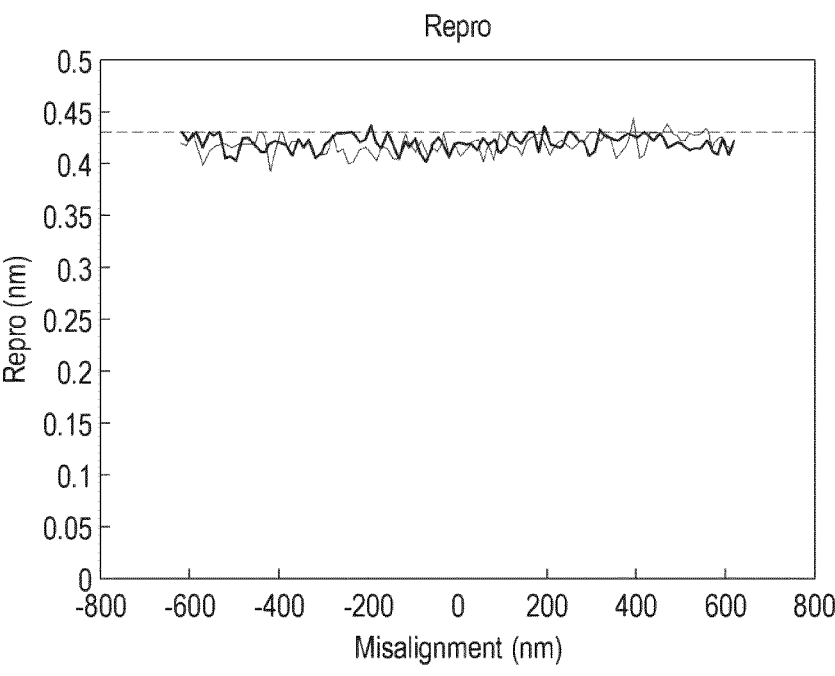
FIG. 16 shows a graph of simulated measurement repeatability (hereinafter referred to as reproducibility) (repro (nm)) for a measurement system according to an embodiment of the invention.

FIG. 16 shows a graph indicating simulated measurement reproducibility (repro (nm)) for eight phase steps with one grating having a 3× smaller pitch than the adjacent grating. The reproducibility per field point may be on par with the reproducibility per field point achieved currently (straight black line in FIG. 16, top). This means that by introducing the additional field points (e.g. at the even field point locations) the amount of data collected in a single measurement may be increased from seven field points to thirteen field points with the same or similar reproducibility per field point. The reproducibility may be considered to be an assessment of the noise of the measurement.

Figure 17:
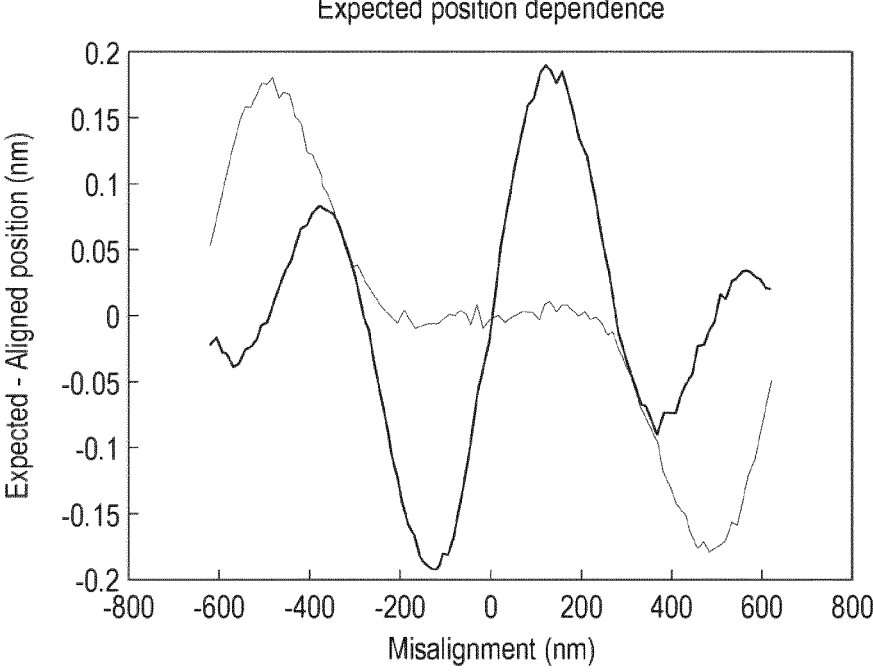
FIG. 17 shows a graph of simulated expected position dependence for a measurement system according to an embodiment of the invention.

FIG. 17 shows a graph indicating simulated expected position dependence for eight phase steps and one grating having a 3× smaller pitch than the adjacent grating. Misalignment (nm) may indicate what happens when the first and second patterned regions are not optimally aligned. That is, when the patterning device is not at the position expected. It may be desired to minimize expected position dependence. This may be done in two ways, increasing the number of phase steps and choosing different pitches. Increasing the number of phase steps has a disadvantage of increasing time of measurement so it may be desired to optimize these variables for a particular implementation.

The reproducibility and expected position dependency may be simulated with a particular camera non-linearity. With this camera non-linearity, for example, eight phase steps may be needed. With a camera chip having less nonlinearity, less than eight phase steps may be used. Increasing the number of phase steps may reduce error in measurements but will increase time for the measurements. With more than 5 phase steps the actual gain in cycle is small when comparing the two measurements of the seven field points with the one measurement of the thirteen field points: 2 (separate odd and even field points measurement)×2 (u, v directions)×5 (phase steps) is not that much slower than 1 (both odd and even field points in one measurement)×2 (u, v directions)×8 (phase steps). In embodiments, the number of phase steps used may be e.g. 4, 5, 6, 7, 8 or 9.

For a third order polynomial fit, that may be used on the seven field point measurements of a measurement system, the thirteen field point measurements may improve the reproducibility of the measurement system by 1.5×. For overlapping spots potentially less improvement for higher order Zernike's may be achieved. However for a particular system control mainly lower order Zernikes may be of interest and thus the results for the higher order Zernikes may not be as important. The measurement may also improve overlay accuracy.

In embodiments, the measurement system may be an alignment sensor rather than a measurement system for measuring aberrations.

For an alignment sensor, generally, an alignment mark, such as a diffraction grating or another type of alignment mark, is provided on a substrate. The alignment sensor projects optical pulses onto the alignment mark (e.g. mask alignment marks M1, M2 or substrate alignment marks P1, P2) in order to be scattered by the alignment mark. An intensity of the scattered optical pulses is measured by a detector, and position information (expressing the position of the alignment mark in respect of for example the alignment sensor) is derived therefrom.

In the present embodiment, patterned regions (i.e. diffraction gratings) of the sensor apparatus may be considered to be the alignment marks. In a similar way as described above, adjacent diffraction gratings may have different pitches to allow overlapping radiation from the adjacent diffraction gratings detected by a radiation detector to be disentangled. For example, thirteen field points, instead of seven field points may be measured using the measurement system to measure alignment of e.g. a substrate.

In embodiments, the alignment sensor may have a sensor apparatus comprising a radiation detector. The alignment sensor may comprise an illumination system arranged to illuminate the sensor apparatus with radiation. The sensor apparatus may comprise a plurality of patterned regions arranged to receive a radiation beam and to form a plurality of diffraction beams, the diffraction beams being separated in a shearing direction. The patterned regions may comprise a diffraction grating, e.g. in the form of a checkerboard with a 50% duty cycle. In the alignment sensor, the patterning device may not be needed and thus there may not be first patterned regions and second patterned regions, although the patterned regions of the alignment sensor may be considered to be in the same position as the second patterned regions of the embodiment of FIG. 12.

In the alignment sensor, in a similar way as with the second patterned regions of the embodiment of FIG. 13B, the pitches of the patterned regions are different in adjacent patterned regions. The pitches of the adjacent patterned regions being different allows overlapping radiation at the radiation detector to be disentangled to differentiate the signals from adjacent patterned regions. This allows an increased number of field points to be measured in a single measurement. This allows an increased amount of data to be used in measuring alignment and may lead to a more accurate alignment measurement.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Other aspects of the invention are set-out as in the following numbered clauses:

1. A measurement system, the measurement system comprising:

a sensor apparatus;

an illumination system arranged to illuminate the sensor apparatus with radiation, the sensor apparatus comprising a patterned region arranged to receive a radiation beam and to form a plurality of diffraction beams, the diffraction beams being separated in a shearing direction;

the sensor apparatus comprising a radiation detector;

wherein the patterned region is arranged such that at least some of the diffraction beams form interference patterns on the radiation detector;

wherein the sensor apparatus comprises a plurality of patterned regions, and wherein pitches of the patterned regions are different in adjacent patterned regions.

2. The measurement system of clause 1, wherein the measurement system is arranged such that the interference patterns from adjacent patterned regions at least partially overlap at the radiation detector.

3. The measurement system of either of clauses 1 or 2, wherein the pitches of alternating patterned regions are the same.

4. The measurement system of any preceding clause, wherein the pitches of the adjacent patterned regions are not even number integer multiples.

5. The measurement system of clause 4, wherein the pitches of the adjacent patterned regions are not integer multiples.

6. The measurement system of any preceding clause, wherein the plurality of patterned regions comprise thirteen patterned regions.

7. The measurement system of any preceding clause, wherein the plurality of patterned regions are positioned at odd and even field point locations.

8. The measurement system of any preceding clause, wherein the plurality of patterned regions extend in an x direction and in a second direction orthogonal to the x direction.

9. The measurement system of any preceding clause, the measurement system further comprising:

a patterning device;

wherein the illumination system is arranged to illuminate the patterning device with radiation, the patterning device comprising a first patterned region arranged to receive the radiation beam and to form a plurality of first diffraction beams, the first diffraction beams being separated in the shearing direction;

wherein the patterned region of the sensor apparatus comprises a second patterned region;

the projection system being configured to project the first diffraction beams onto the sensor apparatus, the second patterned region being arranged to receive the first diffraction beams from the projection system and to form a plurality of second diffraction beams from each of the first diffraction beams such that the first and second patterned regions form a set;

wherein the first and second patterned regions in the set are matched by matching the pitches of the first and second patterned regions in the shearing direction such that at least some of the second diffraction beams formed from at least one of the first diffraction beams are spatially coherent with a second diffraction beam formed from at least one other first diffraction beam to form interference patterns on the radiation detector;

wherein the patterning device comprises a plurality of first patterned regions and the sensor apparatus comprises a plurality of second patterned regions such that there is a plurality of sets, each set comprising one of the plurality of first patterned regions and one of the plurality of second patterned regions, and wherein the pitches of the first patterned regions are different in adjacent sets and/or the pitches of the second patterned regions are different in adjacent sets.

10. The measurement system of clause 9, wherein the pitches of the first patterned regions and the second patterned regions in at least one of the plurality of sets are the same.

11. The measurement system of either of clauses 9 or 10, further comprising a positioning apparatus configured to move at least one of the patterning device and the sensor apparatus in the shearing direction; and a controller configured to:

control the positioning apparatus so as to move at least one of the first patterning device and the sensor apparatus in the shearing direction such that an intensity of radiation received by each part of the radiation detector varies as a function of the movement in the shearing direction so as to form oscillating signals corresponding to the different pitches of the first patterned regions in adjacent sets and/or the different pitches of the second patterned regions in adjacent sets;

determine from the radiation detector phases of harmonics of the oscillating signals at a plurality of positions on the radiation detector; and determine a set of coefficients that characterize an aberration map of the projection system from the phase of the harmonics of the oscillating signals at the plurality of positions on the radiation detector.

12. The measurement system of clause 11, wherein the set of coefficients that characterize the aberration map of the projection system are determined by equating the phases of the harmonics of the oscillating signals to a difference in the aberration map between positions in the pupil plane that are separated in the shearing direction by twice a shearing distance which corresponds to the distance in the pupil plane between two adjacent first diffraction beams and solving to find the set of coefficients.

13. The measurement system of clause 12, wherein the set of coefficients that characterize the aberration map of the projection system are determined by simultaneously solving constraints for the shearing direction and for a second, orthogonal direction.

14. The measurement system of any of clauses 9-13, wherein the plurality of first patterned regions and the plurality of second patterned regions are gratings.

15. A lithographic apparatus comprising the measurement system of any one of clauses 1 to 14.

16. A method for measurement, the method comprising:

illuminating a sensor apparatus with radiation, wherein the sensor apparatus comprises a patterned region arranged to receive at least a portion of the radiation and to form a plurality of diffraction beams, the diffraction beams being separated in a shearing direction;

wherein the sensor apparatus comprises a radiation detector arranged to receive at least a portion of the diffraction beams, wherein the patterned region is arranged such that at least some of the diffraction beams form interference patterns on the radiation detector;

wherein the sensor apparatus comprises a plurality of patterned regions, and wherein pitches of the patterned regions are different in adjacent patterned regions.

17. The method of clause 16, the method further comprising:

illuminating a patterning device with radiation, wherein the patterning device comprises a first patterned region arranged to receive at least a portion of the radiation and to form a plurality of first diffraction beams, the first diffraction beams being separated in the shearing direction;

projecting, with the projection system, at least part of the plurality of first diffraction beams onto the sensor apparatus comprising:

the patterned region comprising a second patterned region arranged to receive the first diffraction beams from the projection system and to form a plurality of second diffraction beams from each of the first diffraction beams; and a radiation detector arranged to receive at least a portion of the second diffraction beams, wherein the first and second patterned regions in the set are matched by matching the pitches of the first and second patterned regions in the shearing direction such that at least some of the second diffraction beams formed from at least one of the first diffraction beams are spatially coherent with a second diffraction beam formed from at least one other first diffraction beam to form interference patterns on the radiation detector;

wherein the patterning device comprises a plurality of first patterned regions and the sensor apparatus comprises a plurality of second patterned regions such that there is a plurality of sets, each set comprising one of the plurality of first patterned regions and one of the plurality of second patterned regions, and wherein the pitches of the first patterned regions are different in adjacent sets and/or the pitches of the second patterned regions are different in adjacent sets.

18. The method of clause 17, further comprising moving at least one of the patterning device and the sensor apparatus in the shearing direction such that an intensity of radiation received by each part of the radiation detector varies as a function of the movement in the shearing direction so as to form a plurality of oscillating signals corresponding to the different pitches of the first patterned regions in adjacent sets and/or the different pitches of the second patterned regions in adjacent sets;

determining from the radiation detector phases of harmonics of the oscillating signals at a plurality of positions on the radiation detector; and determining a set of coefficients that characterize an aberration map of the projection system from the phase of the harmonics of the oscillating signals at the plurality of positions on the radiation detector.

19. The method of either of clauses 17 or 18, further comprising determining the set of coefficients that characterize the aberration map of the projection system by equating the phases of the harmonics of the oscillating signals to a difference in the aberration map between positions in the pupil plane that are separated in the shearing direction by twice a shearing distance which corresponds to the distance in the pupil plane between two adjacent first diffraction beams and solving to find the set of coefficients.

20. The method of any of clauses 17 to 19, further comprising determining the set of coefficients that characterize the aberration map of the projection system by simultaneously solving constraints for the shearing direction and for a second, orthogonal direction.

21. The method of any of clauses 17 to 20, further comprising moving the at least one of the patterning device and the sensor apparatus in the shearing direction in phase steps in a range of 4-9 to form the plurality of oscillating signals.

22. A computer readable medium carrying a computer program comprising computer readable instructions configured to cause a computer to carry out a method according to any one of clauses 16 to 21.

23. A computer apparatus comprising:

a memory storing processor readable instructions, and a processor arranged to read and execute instructions stored in said memory, wherein said processor readable instructions comprise instructions arranged to control the computer to carry out the method according to any one of clauses 16 to 21.

The invention claimed is:

1. A measurement system, comprising:

an illumination system arranged to illuminate a measurement patterning device with radiation, wherein the measurement patterning device is disposed in a pupil plane of the illumination system and comprises a plurality of first patterned regions arranged to receive the radiation and to form a plurality of diffraction beams, the plurality of diffraction beams being separated in a shearing direction;

a radiation detector; and a grating arranged to receive the plurality of diffraction beams, wherein the grating comprises a plurality of second patterned regions arranged such that at least some of the plurality of diffraction beams form interference patterns on the radiation detector;

wherein the first patterned regions of the measurement patterning device comprise a plurality of first sets of paired patterned regions and a plurality of second sets of paired patterned regions arranged in an alternate manner between directly adjacent ones of the plurality of first sets of paired patterned regions across an entire major axis of the measurement patterning device, and wherein pitches of the plurality of first and second sets of paired patterned regions are different.

2. The measurement system of claim 1, wherein the measurement system is arranged such that the interference patterns from adjacent patterned regions at least partially overlap at the radiation detector.

3. The measurement system of claim 1, wherein the pitches of the plurality of first sets of paired patterned regions are the same.

4. The measurement system of claim 1, wherein the pitches of the adjacent patterned regions are not even number integer multiples.

5. The measurement system of claim 4, wherein the pitches of the adjacent patterned regions are not integer multiples.

6. The measurement system of claim 1, wherein the plurality of first patterned regions comprise thirteen patterned regions.

7. The measurement system of claim 1, wherein the plurality of first patterned regions are positioned at odd and even field point locations.

8. The measurement system of claim 1, wherein the plurality of first patterned regions extend in an x direction and in a second direction orthogonal to the x direction.

9. The measurement system of claim 1 wherein:

the plurality of diffraction beams comprises a first set of diffraction beams;

the measurement system further comprising a projection system configured to project the first set of diffraction beams onto the grating; and the first and second patterned regions are matched by matching the pitches of the first and second patterned regions in the shearing direction such that at least some of a second set of diffraction beams formed from at least one of the first set of diffraction beams are spatially coherent to form interference patterns on the radiation detector.

10. The measurement system of claim 1, wherein the pitches of the first patterned regions and the second patterned regions in at least one of the plurality of sets are the same.

11. The measurement system of claim 1, further comprising:

a positioning apparatus; and a controller configured to:

control the positioning apparatus so as to move at least one of the measurement patterning device and the grating in the shearing direction such that an intensity of radiation received by each part of the radiation detector varies as a function of the movement in the shearing direction so as to form oscillating signals corresponding to the different pitches of the plurality of first and second sets of paired patterned regions;

determine from the radiation detector phases of harmonics of the oscillating signals at a plurality of positions on the radiation detector; and determine a set of coefficients that characterize an aberration map of the projection system from the phase of the harmonics of the oscillating signals at the plurality of positions on the radiation detector.

12. The measurement system of claim 11, wherein the set of coefficients that characterize the aberration map of the projection system are determined by equating the phases of the harmonics of the oscillating signals to a difference in the aberration map between positions in the pupil plane that are separated in the shearing direction by twice a shearing distance which corresponds to the distance in the pupil plane between two adjacent ones of the plurality of diffraction beams and solving to find the set of coefficients.

13. The measurement system of claim 12, wherein the set of coefficients that characterize the aberration map of the projection system are determined by simultaneously solving constraints for the shearing direction and for a second, orthogonal direction.

14. A lithographic apparatus comprising the measurement system of claim 1.

15. A method for measurement using the measurement system of claim 1.

16. The method of claim 15, further comprising:

moving at least one of the measurement patterning device and the grating in the shearing direction such that an intensity of radiation received by each part of the radiation detector varies as a function of the movement in the shearing direction so as to form a plurality of oscillating signals corresponding to the different pitches of the plurality of first and second sets of paired patterned regions;

determining from the radiation detector phases of harmonics of the oscillating signals at a plurality of positions on the radiation detector; and determining a set of coefficients that characterize an aberration map of the projection system from the phase of the harmonics of the oscillating signals at the plurality of positions on the radiation detector.

17. The method of claim 16, further comprising determining the set of coefficients that characterize the aberration map of the projection system by equating the phases of the harmonics of the oscillating signals to a difference in the aberration map between positions in the pupil plane that are separated in the shearing direction by twice a shearing distance which corresponds to the distance in the pupil plane between two adjacent ones of the plurality of diffraction beams and solving to find the set of coefficients.

18. The method of claim 16, further comprising determining the set of coefficients that characterize the aberration map of the projection system by simultaneously solving constraints for the shearing direction and for a second, orthogonal direction.

* * * * *